United States Patent
Koshti et al.

(10) Patent No.: US 12,142,508 B2
(45) Date of Patent: Nov. 12, 2024

(54) FACTORY INTERFACE ROBOTS USABLE WITH INTEGRATED LOAD LOCKS

(71) Applicant: APPLIED MATERIALS, INC., Santa Clara, CA (US)

(72) Inventors: Sushant S. Koshti, Sunnyvale, CA (US); Paul B. Reuter, Austin, TX (US); David Phillips, Austin, TX (US); Jacob Newman, Palo Alto, CA (US); Andrew J. Constant, Cupertino, CA (US); Michael R. Rice, Pleasonton, CA (US); Shay Assaf, Santa Clara, CA (US); Srinivas Poshatrahalli Gopalakrishna, Bangalore (IN); Devendra Channappa Holeyannavar, Bangalore (IN); Douglas B. Baumgarten, Round Rock, TX (US); Arunkumar Ramachandraiah, Bengaluru (IN); Narayanan Ramachandran, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 378 days.

(21) Appl. No.: 17/499,109

(22) Filed: Oct. 12, 2021

(65) Prior Publication Data

US 2023/0113673 A1  Apr. 13, 2023

(51) Int. Cl.
*H01L 21/677* (2006.01)
*B65G 1/04* (2006.01)
*H01L 21/687* (2006.01)

(52) U.S. Cl.
CPC ...... *H01L 21/67778* (2013.01); *B65G 1/0407* (2013.01); *B65G 1/0485* (2013.01); *H01L 21/67775* (2013.01); *H01L 21/68707* (2013.01)

(58) Field of Classification Search
CPC ......... H01L 21/67778; H01L 21/68707; H01L 21/67775; B65G 1/0407; B65G 1/0485
See application file for complete search history.

(56) References Cited

U.S. PATENT DOCUMENTS

| | | |
|---|---|---|
| 5,376,212 A | 12/1994 | Saiki |
| 6,034,000 A | 3/2000 | Heyder et al. |

(Continued)

FOREIGN PATENT DOCUMENTS

| | | |
|---|---|---|
| JP | H0927536 A | 1/1997 |
| JP | 2003045933 A | 2/2003 |

(Continued)

OTHER PUBLICATIONS

PCT International Search Report and Written Opinion for International Application No. PCT/US2022/046317 mailed Feb. 9, 2023, 11 pages.

(Continued)

*Primary Examiner* — Saul Rodriguez
*Assistant Examiner* — Ashley K Romano
(74) *Attorney, Agent, or Firm* — Lowenstein Sandler LLP

(57) ABSTRACT

A factory interface for an electronic device manufacturing system can include a load lock disposed within the interior volume of a factory interface and a factory interface robot disposed within the interior volume of the factory interface. The factory interface robot can be configured to transfer substrates between a first set of substrate carriers and the first load lock. The factory interface robot can comprise a vertical tower, a plurality of links, and an end effector.

17 Claims, 22 Drawing Sheets

(56) References Cited

U.S. PATENT DOCUMENTS

| | | | |
|---|---|---|---|
| 6,082,951 A | 7/2000 | Nering et al. | |
| 6,270,306 B1 | 8/2001 | Otwell et al. | |
| 6,486,444 B1 | 11/2002 | Fairbairn et al. | |
| 6,647,665 B1 | 11/2003 | Tabrizi et al. | |
| 7,010,388 B2 | 3/2006 | Mitchell et al. | |
| 7,419,346 B2 | 9/2008 | Danna et al. | |
| 7,699,574 B2 | 4/2010 | Ferrara | |
| 7,942,619 B2 | 5/2011 | Hashimoto et al. | |
| 7,949,425 B2 | 5/2011 | Mitchell et al. | |
| 7,997,851 B2 * | 8/2011 | Moore | H01L 21/67201 414/805 |
| 9,312,153 B2 | 4/2016 | Hiroki | |
| 10,600,665 B2 * | 3/2020 | Caveney | B25J 9/043 |
| 10,720,348 B2 * | 7/2020 | Rice | H01L 21/67742 |
| 11,581,203 B2 * | 2/2023 | Newman | B65G 47/90 |
| 11,688,619 B2 | 6/2023 | Wakabayashi | |
| 11,862,506 B2 | 1/2024 | Amikura et al. | |
| 2002/0094696 A1 | 7/2002 | Heyder et al. | |
| 2004/0234359 A1 | 11/2004 | Mitchell et al. | |
| 2006/0151735 A1 | 7/2006 | Lee et al. | |
| 2008/0093022 A1 | 4/2008 | Yilmaz et al. | |
| 2010/0111648 A1 | 5/2010 | Tamura et al. | |
| 2010/0190343 A1 | 7/2010 | Aggarwal et al. | |
| 2013/0115028 A1 | 5/2013 | Kremerman et al. | |
| 2014/0271054 A1 | 9/2014 | Weaver et al. | |
| 2014/0363258 A1 | 12/2014 | Iwamoto et al. | |
| 2016/0284578 A1 | 9/2016 | Weaver et al. | |
| 2017/0067163 A1 | 3/2017 | Papasouliotis et al. | |
| 2018/0068881 A1 | 3/2018 | Cavins et al. | |
| 2018/0151403 A1 | 5/2018 | Smith | |
| 2018/0229945 A1 | 8/2018 | Suzuki et al. | |
| 2018/0286716 A1 | 10/2018 | Sakata | |
| 2019/0355600 A1 | 11/2019 | Rice | |
| 2019/0362995 A1 | 11/2019 | Ito et al. | |
| 2020/0219744 A1 | 7/2020 | Kim et al. | |
| 2020/0312691 A1 | 10/2020 | Kagami et al. | |
| 2022/0044952 A1 | 2/2022 | Wakabayashi | |
| 2022/0328340 A1 * | 10/2022 | Song | H01L 21/68707 |
| 2022/0395986 A1 * | 12/2022 | Blank | B25J 9/042 |

FOREIGN PATENT DOCUMENTS

| | | |
|---|---|---|
| JP | 4389424 B2 | 12/2009 |
| JP | 2010135495 A | 6/2010 |
| JP | 4712379 B2 | 6/2011 |
| JP | 2017108048 A | 6/2017 |
| JP | 2019161119 A | 9/2019 |
| KR | 20140133534 A | 11/2014 |
| KR | 10-2018-0038577 A1 | 4/2018 |
| KR | 102563297 * | 4/2021 |

OTHER PUBLICATIONS

International Preliminary Report on Patentability for International Application No. PCT/US2021/048681, mailed Mar. 16, 2023, 7 Pages.

International Search Report and Written Opinion for International Application No. PCT/US2021/048681, mailed Dec. 1, 2021, 11 Pages.

International Search Report and Written Opinion for International Application No. PCT/US2022/018768, mailed Jun. 21, 2022, 12 Pages.

* cited by examiner

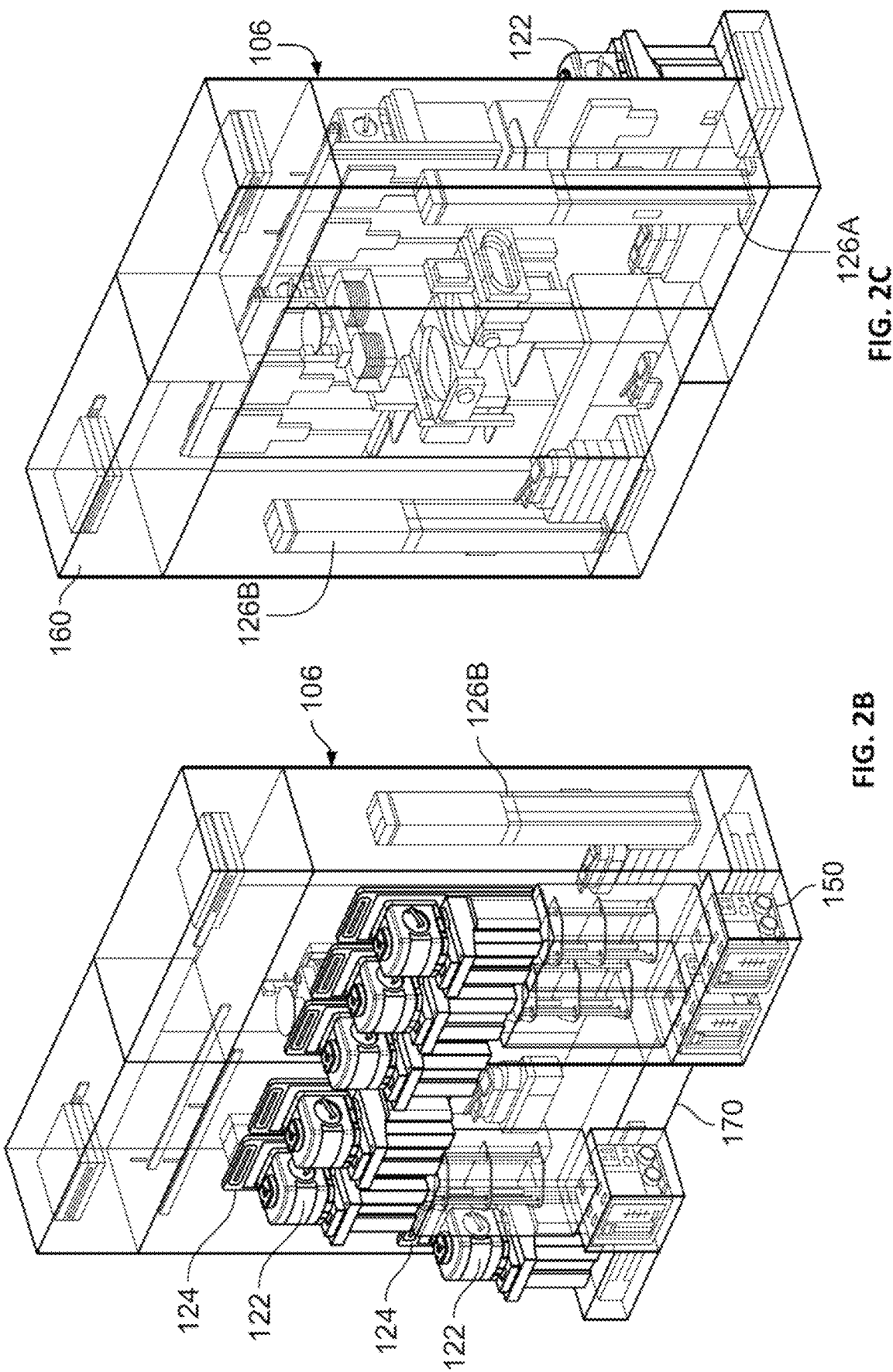

1100

Receiving, by a load port, a substrate carrier
1110

Positioning the load port door from the closed position to the open position
1120

Retrieving, by a factory interface robot, a substrate from the substrate carrier
1130

```
┌─────────────────────────────────────────────────────────────────────────────┐
│   Retrieve, by a first factory interface robot, a substrate from a substrate carrier │
│                                      1210                                       │
└─────────────────────────────────────────────────────────────────────────────┘
                                        │
                                        ▼
┌─────────────────────────────────────────────────────────────────────────────┐
│ Transfer the substrate from the first factory interface robot to a second factory interface robot, │
│  wherein the first factory interface robot and the second factory interface robot are disposed │
│                              within a factory interface                          │
│                                      1220                                       │
└─────────────────────────────────────────────────────────────────────────────┘
                                        │
                                        ▼
┌─────────────────────────────────────────────────────────────────────────────┐
│  Place the substrate, via the second factory interface robot, inside a load lock disposed within │
│                               the factor interface                              │
│                                      1230                                       │
└─────────────────────────────────────────────────────────────────────────────┘
```

FIG. 12

FACTORY INTERFACE ROBOTS USABLE WITH INTEGRATED LOAD LOCKS

TECHNICAL FIELD

Embodiments of the present disclosure relate, in general, to systems and methods for enabling multiple factory interface robots to interact with load locks integrated into a factory interface footprint space.

BACKGROUND

An electronic device manufacturing system can include one or more tools or components for transporting and manufacturing substrates. Such tools or components can include a factory interface connected to a load lock and/or transfer chamber. In some instances, the load lock is positioned between the transfer chamber and the factory interface. However, such a configuration can be inefficient due to the manufacturing system using a large operational footprint. For example, this configuration can have a long width and/or length and large sections of unused space. Accordingly, improved electronic device manufacturing systems, apparatus, and methods for transporting and manufacturing substrates with increased footprint efficiency are sought.

SUMMARY

Some of the embodiments described cover a factory interface for an electronic device manufacturing system. The factory interface includes a first load lock disposed within the interior volume of a factory interface and a first factory interface robot disposed within the interior volume of the factory interface. The first factory interface robot is configured to transfer substrates between a first set of substrate carriers and the first load lock. The factory interface robot comprises a vertical tower, a plurality of links, and an end effector.

In some embodiments, a factory interface robot comprises a vertical tower configured to enable a plurality of robot links to traverse in a z-axis. The plurality of links are coupled to the vertical tower and configured to move an end effector along an x-axis and a y-axis. The end effector is coupled to the plurality of links and configured to handle a substrate, wherein the factory interface robot and a load lock are disposed within an interior volume of a factory interface.

In some embodiments, a method for transporting substrates from a first factory interface robot to a second factory interface robot includes retrieving, by an end effector of the first factory interface robot, a substrate from a substrate carrier. The method further includes adjusting a vertical position of the end effector by a vertical drive mechanism of the factory interface robot. The method further includes transferring the substrate from the first factory interface robot to a second factory interface robot, wherein the first factory interface robot and the second factory interface robot are disposed within a factory interface.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2B is an isometric view of a factory interface focusing on the front of factory interface, according to aspects of the present disclosure.

FIG. 2C is another isometric view of a factory interface focusing on the back of factory interface, according to aspects of the present disclosure.

FIG. 11 is a method for transporting substrates from a substrate carrier to a factory interface, in accordance with embodiments of the present disclosure.

FIG. 12 is a method for method for transporting substrates from a first factory interface robot to a second factory interface robot, in accordance with embodiments of the present disclosure.

DETAILED DESCRIPTION OF EMBODIMENTS

Figure 1A:
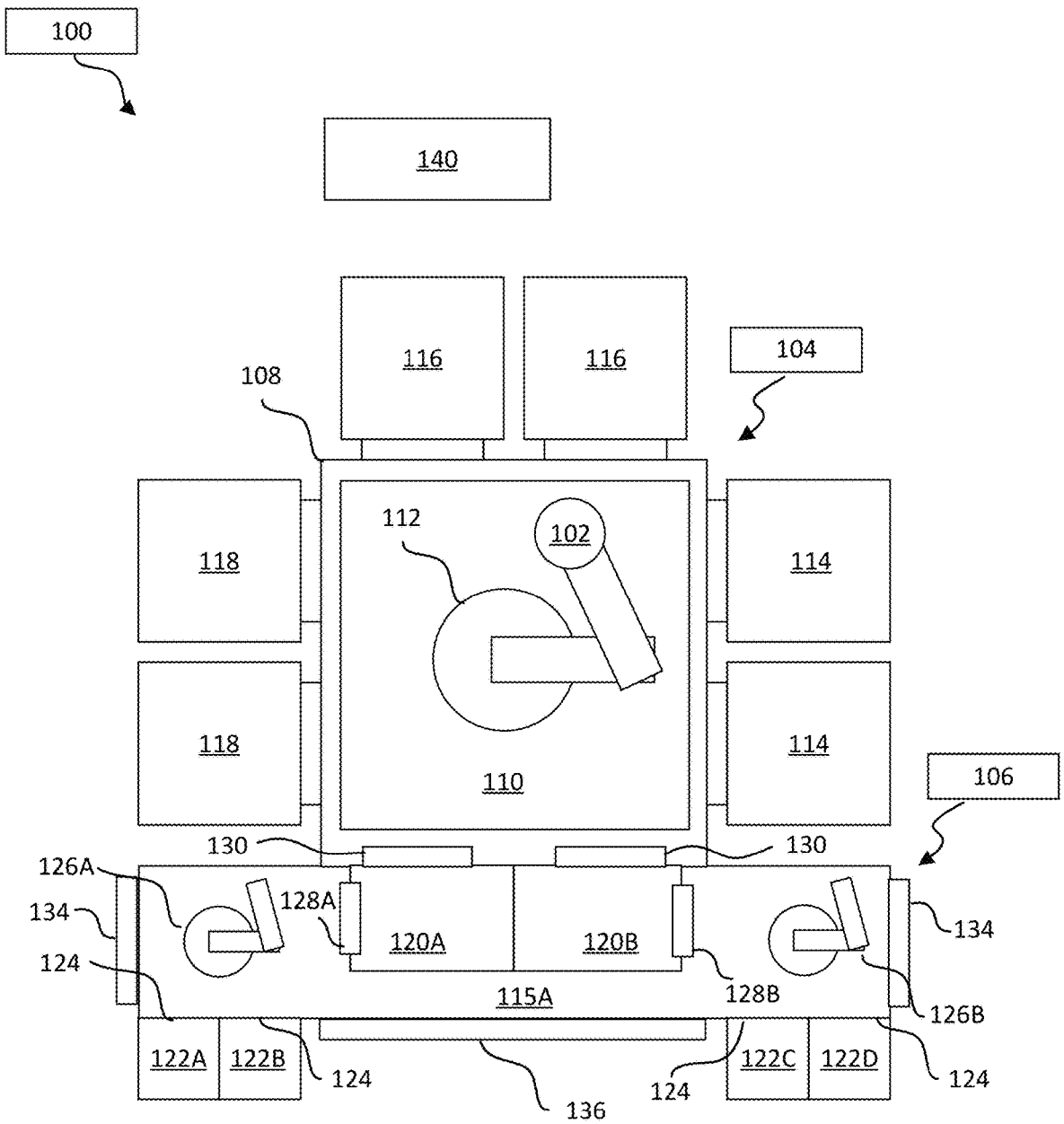
FIG. 1A is a top schematic view of an example electronic device manufacturing system, according to aspects of the present disclosure.

Embodiments described herein are related to systems and methods for enabling factory interface robots to interact with load locks integrated into a factory interface footprint space. Embodiments cover multiple different designs for factory interfaces and load locks that reduce a total footprint of electronic device manufacturing systems. Embodiments further cover designs for a shortened load port that reduces the vertical space consumed of electronic device manufacturing systems, as well as factory interface robots configured to interact with the integrated load locks and shortened load ports.

Floor space in fabrication facilities (fabs) for electronic devices is very costly, and any reduction in the footprint of electronic device manufacturing systems can reduce the cost of ownership of those electronic device manufacturing systems. Reducing the footprint of the systems also allows the owner to fit more systems into the limited fab space, which in turn allows the processing of more wafers. Thus, embodiments described herein provide factory interfaces, load locks, load ports, and factory interface robots that reduce the footprint and overall cost of ownership of electronic device manufacturing systems.

In some embodiments, load locks are integrated into the interior of a factory interface, thus reducing the floor space traditionally dedicated for load locks. In some embodiments, a factory interface is split into two smaller factory interfaces (e.g., a left and right factory interface) with one or more load locks positioned between the two smaller factory interfaces. Each of the two smaller factory interfaces can include a factory interface robot configured to position substrates from a substrate carrier (coupled to a load port) to a load lock, and vice versa. The factor interface robot can include a vertical tower structured and configured to enable multiple robot links (e.g., arms) to traverse in the Z-direction (e.g., up and down vertically). For example, the vertical tower can include a vertical drive mechanism configured to provide the robot links with linear movement alone the Z-axis. A proximal link of robot links can be coupled to the vertical drive mechanism while a distal link of the robot links can be coupled to end effector configured to handle particular objects, such as substrates (e.g., wafers). The robot links can include a link and joint configuration that enables the links to move the end effector along the x-axis and the y-axis (similar to a SCARA robot). This combination of the vertical drive mechanism and the link and joint configuration enable factory interface robot to operate in compact spaces while maintaining the ability to move the end effector in three dimensions. In such a configuration, the total footprint of the combined space of the load locks plus the factory interfaces is reduced as compared to a traditional load lock and factory interface configuration, while further enabling the factor interface robot to efficiently operate in a space reduced by the inclusion of load locks without increasing the overall size of the factory interface.

In some embodiments, the load ports of the factory interface each include an actuator (e.g., a pneumatic mechanism, an electromechanically driven actuator, or a similar mechanism) for opening the load port door that enables reducing the overall height of the load port as compared to traditional load ports. In some embodiments, reduction in vertical space occupied by the load port allows for integrating auxiliary components into said vertical space. The auxiliary components can include substrate storage containers, metrology equipment, servers, air conditioning units, and others. For example, the load port can mounted to a wall of the factory interface. Due to the compact size of the wall mounted load port, at least one auxiliary component (e.g., a substrate storage container, metrology equipment, a server, an air conditioning unit, etc.) can be positioned below the load port. In addition, the load port is capable of being mounted on a horizontal plane similar to that of a load lock used to transfer the substrates to process chambers for processing. As such, mounting the load port on the horizontal plane similar to that of the load lock eliminate or reduce excess motion (e.g., vertical motion) by a factory interface robot transferring substrates from the substrate carrier to the load lock. Thus, in such a configuration, the total footprint of the electronic device manufacturing system is further reduced by combining the spaces occupied by the load port and the auxiliary component, as compared to a traditional load port and auxiliary component.

By providing a system that integrates the load locks and the factory interface into a single volume, and reduces the size of the load port and factory interface robot, the electronic device manufacturing system is provided with an increased foot print efficiency. Specifically, prior electronic device manufacturing system designs position the load lock(s) between the transfer chamber and the factory interface, which give the manufacturing system a long profile. In some embodiments of the present disclosure, the load locks and the factory interface are integrated into a single volume, where one or more factory interface robots are disposed within the volume and to the sides of the load locks. Thus, the manufacturing system has a decreased depth.

The integration of the load locks into the factory interface can result in traditional factory interface robots lacking adequate space to perform operations. This is because traditional factory interface robots use links and joints to position the end effector in the z-direction, which requires space that may not be available with integrated load locks. In some embodiments of the present disclosure, the factory interface robot includes a vertical tower having a vertical drive mechanism configured to provide the links with linear movement in the z-direction, thus enabling the factory interface robot to operate in a space reduced by integrated load locks.

Further, prior electronic device manufacturing systems position the load port vertically along a side of the factory interface, from the floor upwards, which takes up the majority or entirety of usable space in a vertical volume. In some embodiments of the present disclosure, the load port is shortened (by, for example, two feet) and is wall mounted (rather than floor standing), thus allowing for placement of one or more auxiliary components below the load port and integrating the load port and the auxiliary component(s) into a single volume. Accordingly, the manufacturing system of the present disclosure has a decreased footprint, allows for additional throughput per square meter of the volume, all of which can improve overall system yield and/or cost (e.g., fabrication cost, materials cost, packaging cost, shipment cost, etc.).

Figure 1B:
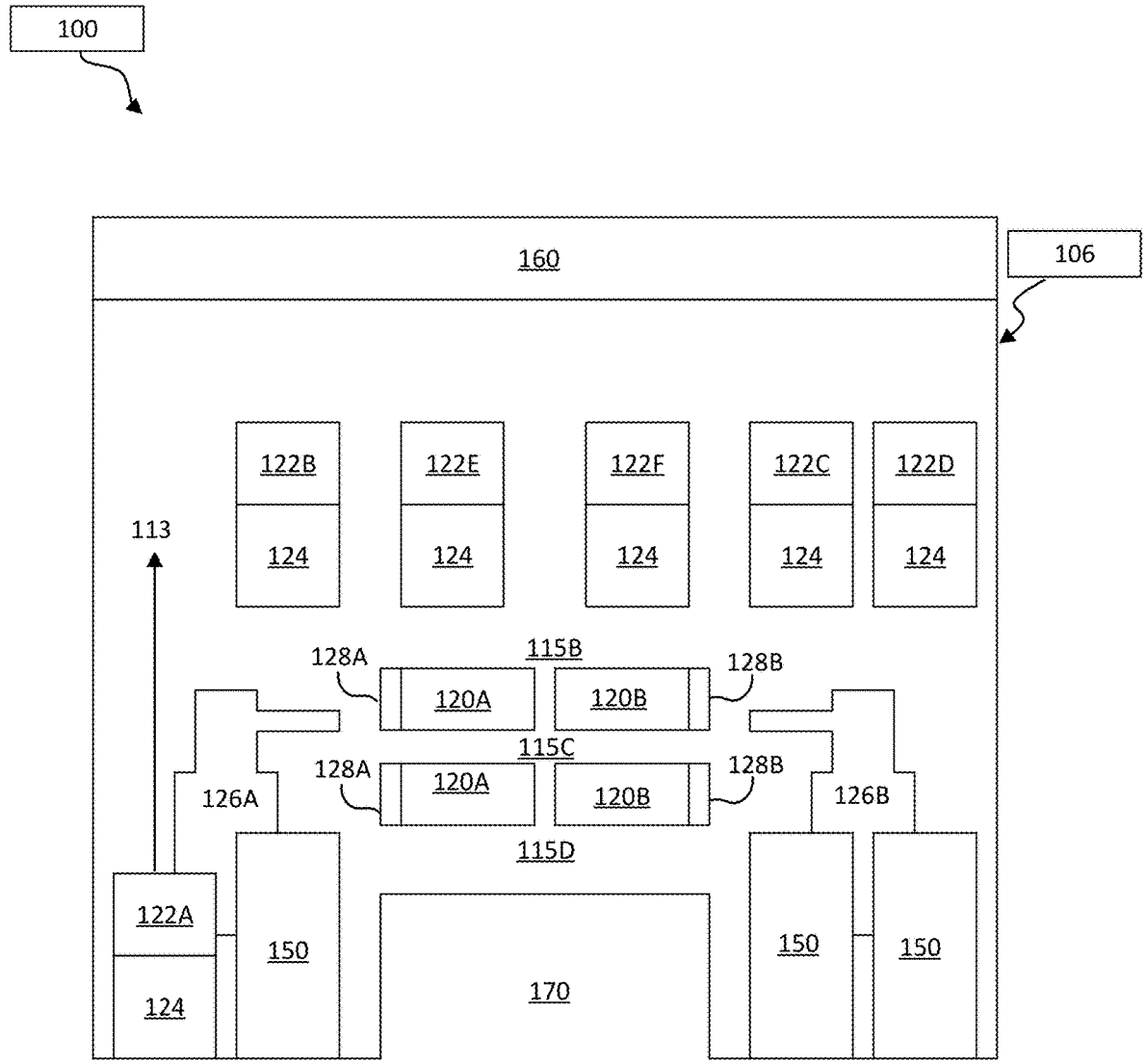
FIG. 1B is a front schematic view of an example electronic device manufacturing system, according to aspects of the present disclosure, according to aspects of the present disclosure.
Figure 1C:
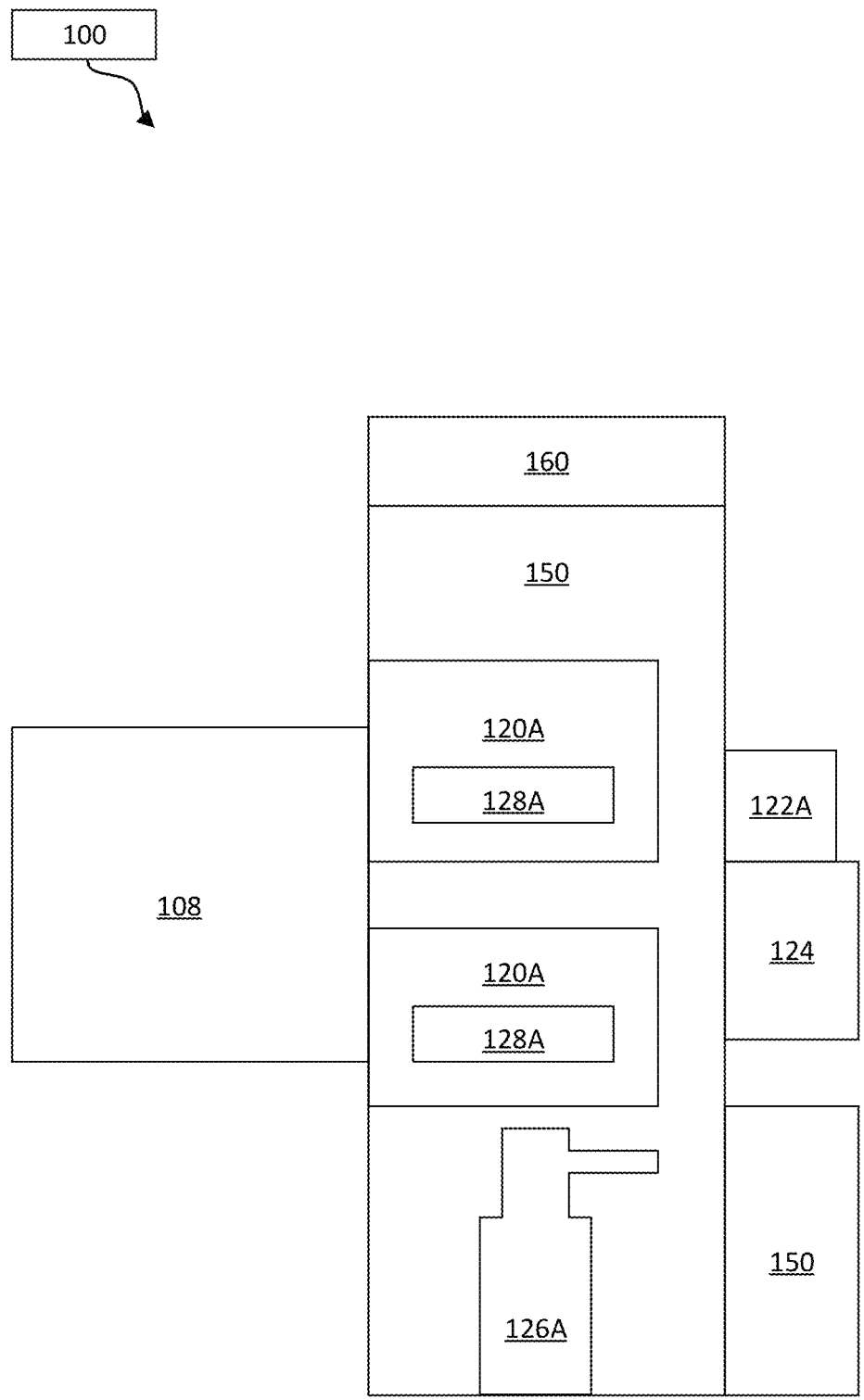
FIG. 1C is a side schematic view of example electronic device manufacturing system, according to aspects of the present disclosure.
Figure 1D:
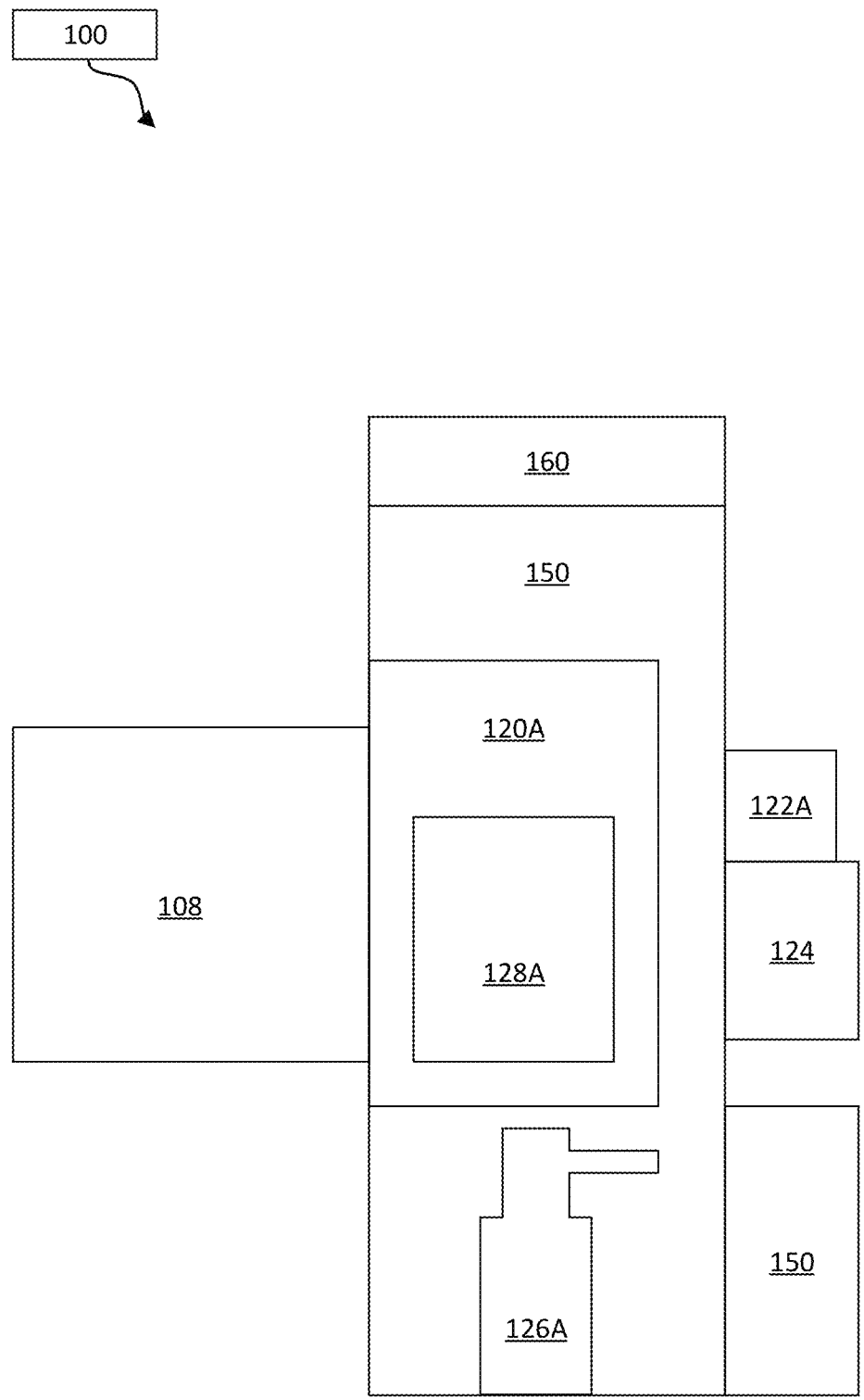
FIG. 1D is another side schematic view of example electronic device manufacturing system, according to aspects of the present disclosure.

FIGS. 1A-1D describe electronic device manufacturing system 100 having two factory interface robots 126A-B configured to interact with a respective load lock 120A-B, where the load locks 120A-B are integrated into the volume of a factory interface 106. FIG. 1A is a top schematic view of the example electronic device manufacturing system 100, according to aspects of the present disclosure. FIG. 1B is a front schematic view of the example electronic device manufacturing system 100, according to aspects of the present disclosure. FIGS. 1C and 1D are side schematic views of the example electronic device manufacturing system 100, according to aspects of the present disclosure. It is noted that FIGS. 1A-1D are used for illustrative purposes, and that different component may be positioned in different location in relation to each view.

Figure 2A:
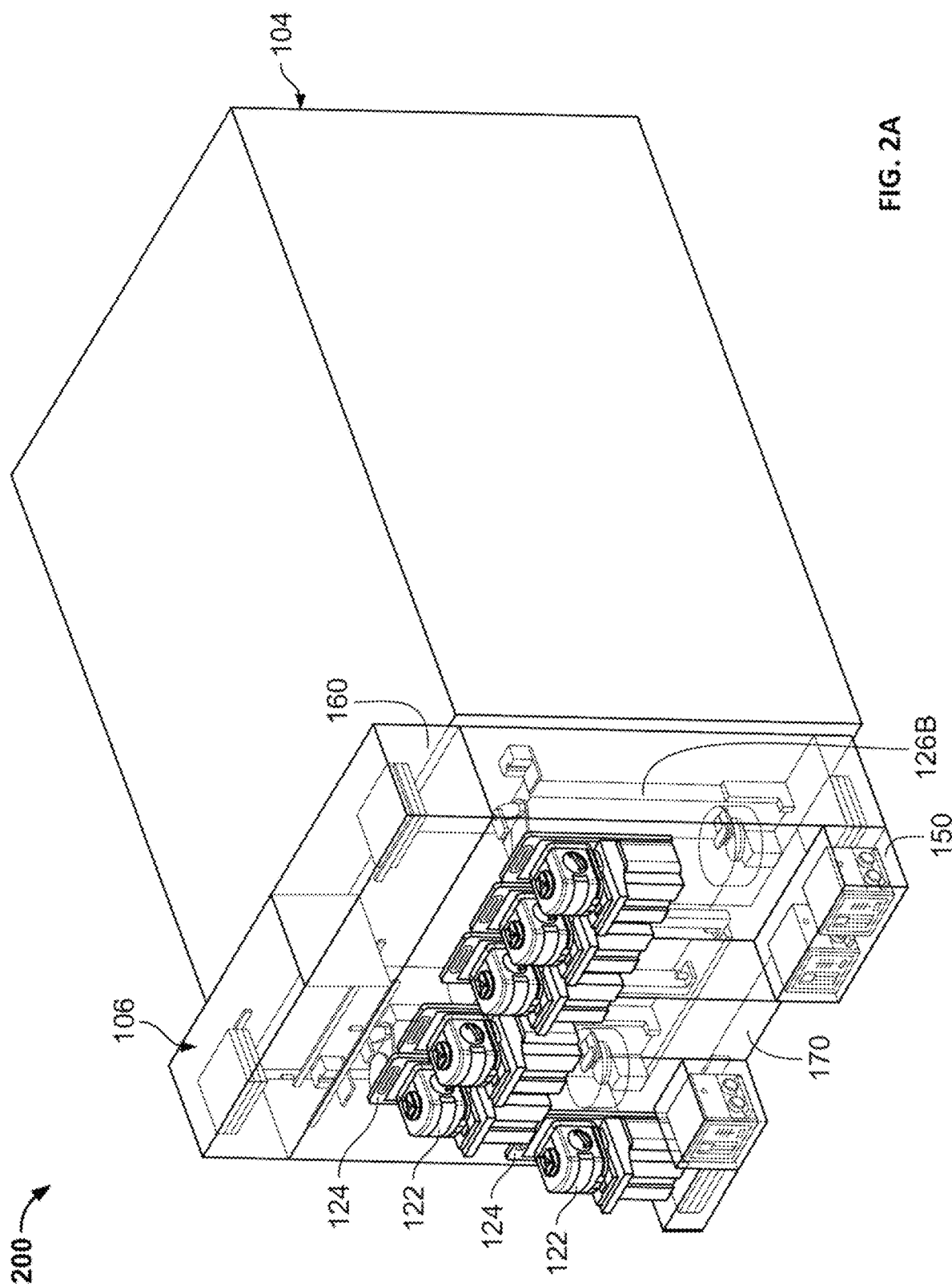
FIG. 2A is an isometric view of an electronic device manufacturing system, according to aspects of the present disclosure.
Figure 2E:
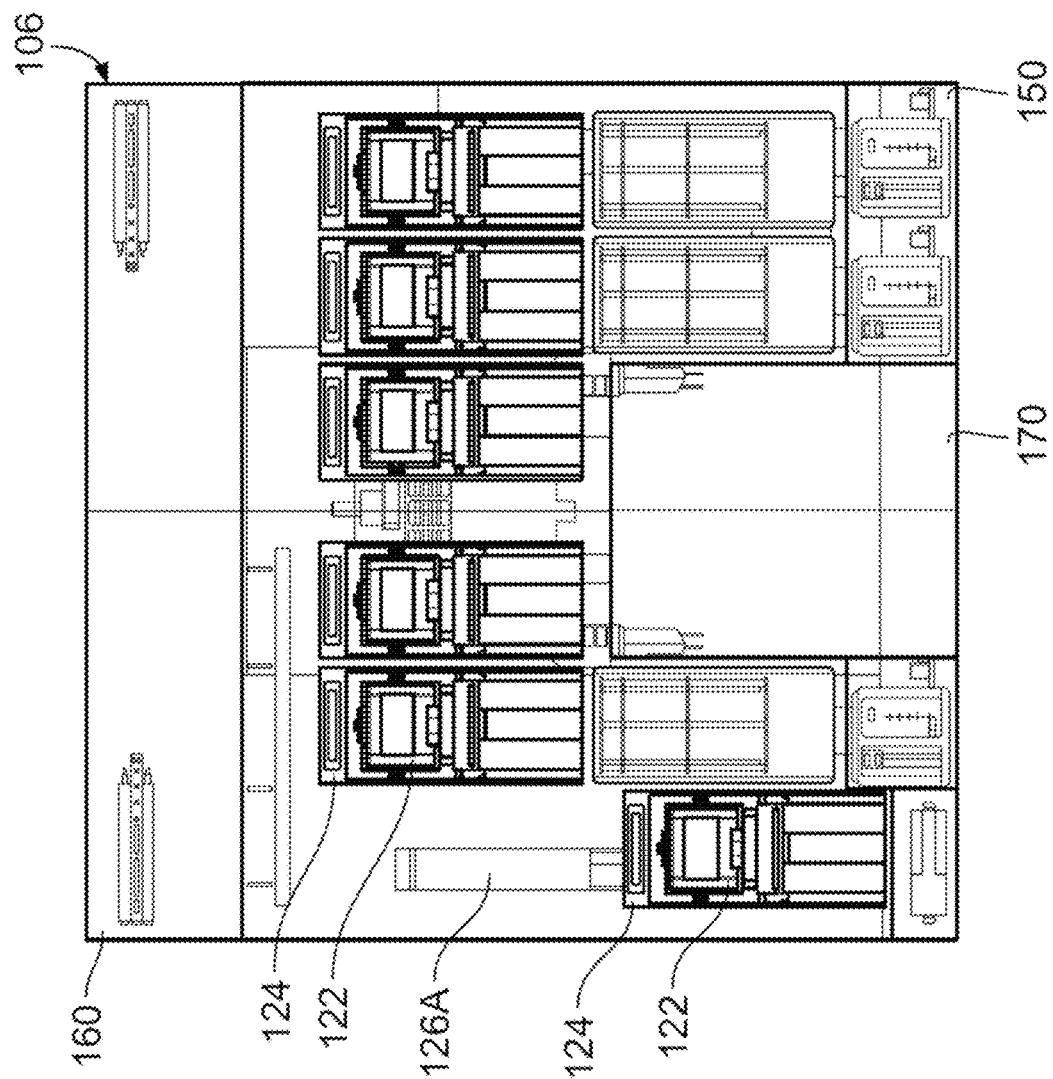
FIG. 2E is a front view of a factory interface, according to aspects of the present disclosure.
Figure 2D:
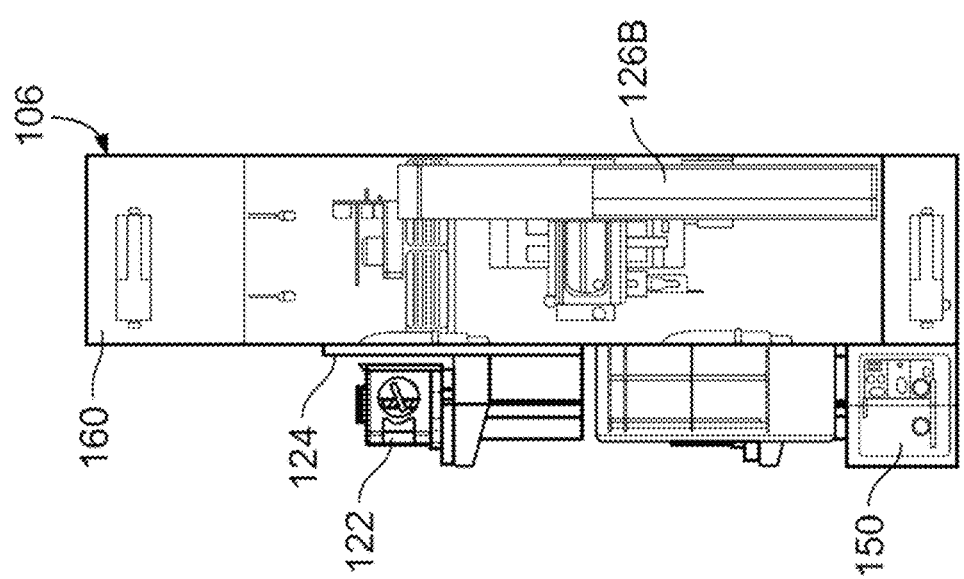
FIG. 2D is a side view of a factory interface focusing on the back of factory interface, according to aspects of the present disclosure.
Figure 2F:
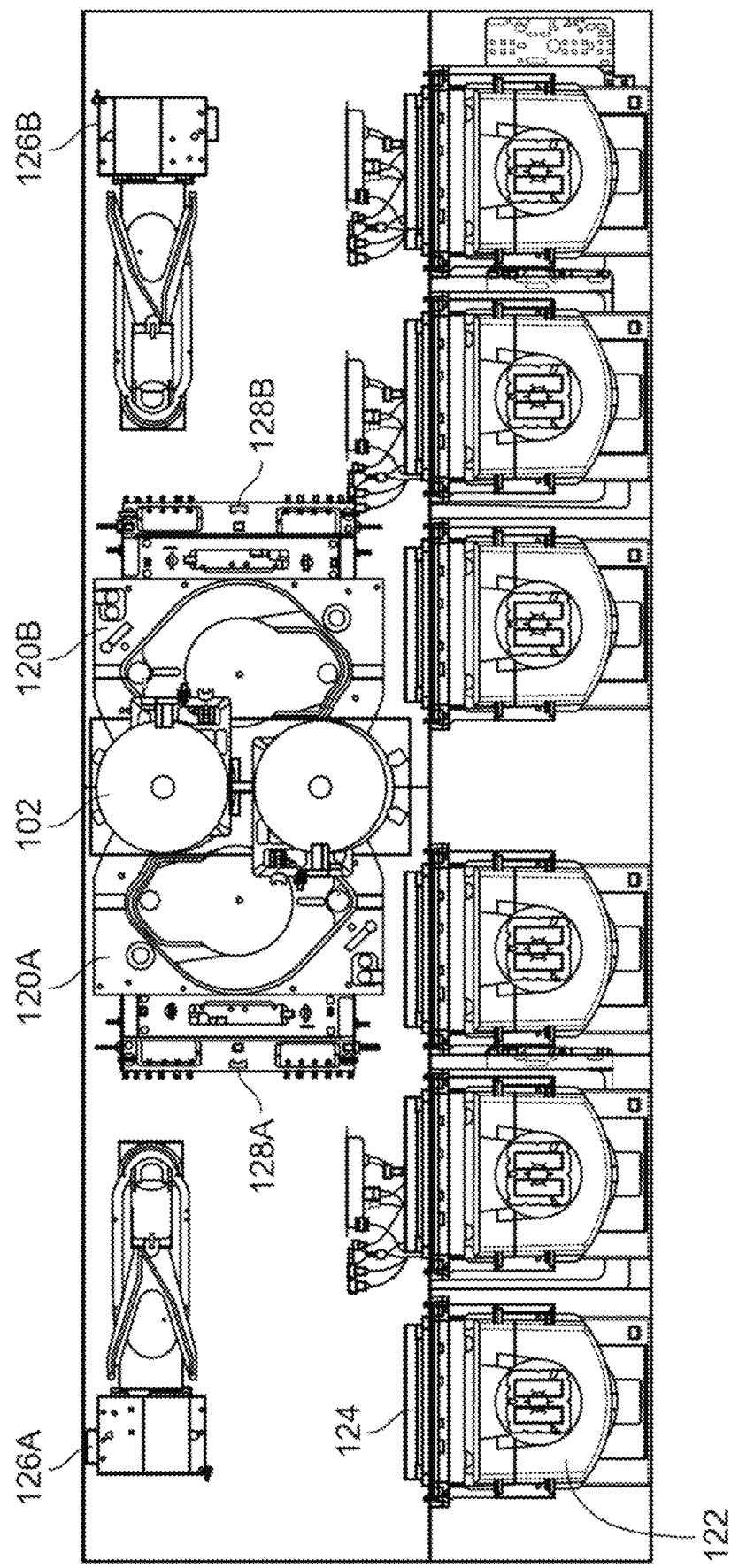
FIG. 2F is a top view of a factory interface, according to aspects of the present disclosure

FIGS. 2A-2F describe electronic device manufacturing system 200 which similarly has two factory interface robots 126A-B configured to interact with a respective load lock 120A-B, where the load locks 120A-B are integrated into the volume of factory interface 106. Electronic device manufacturing system 200 can be similar or the same as electronic device manufacturing system 100. In particular, FIGS. 1A-1D illustrate different block views of electronic device manufacturing system 100 while FIGS. 2A-2F illustrate different computer aided design (CAD) views of electronic device manufacturing system 200. FIG. 2A is an isometric view of electronic device manufacturing system 200, according to aspects of the present disclosure. FIG. 2B is an isometric view of factory interface 106 focusing on the front of factory interface 106, according to aspects of the present disclosure. FIG. 2C is another isometric view of factory interface 106 focusing on the back of factory interface 106, according to aspects of the present disclosure. FIG. 2D is a side view of factory interface 106 focusing on the back of factory interface 106. FIG. 2E is a front view of factory interface 106, according to aspects of the present disclosure. FIG. 2F is a top view of factory interface 106, according to aspects of the present disclosure. It is noted that FIGS. 2A-2F are used for illustrative purposes, and that different component may be positioned in different location in relation to each view.

Electronic device manufacturing systems 100 and 200 (each also referred to as an electronics processing system) are configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing systems 100 and 200 include a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2 link SCARA robot, a 3 link SCARA robot, a 4 link SCARA robot, and so on.

Load locks 120A-B can be coupled to housing 108 and transfer chamber 110. Load locks 120A-B can be disposed within an interior volume of factory interface 106 and can be configured to interface with transfer chamber 110 and factory interface 106. Load locks 120A-B can have an environmentally-controlled atmosphere that is changed from a vacuum environment (where substrates are transferred to and from transfer chamber 110) to an at or near atmospheric-pressure inert-gas environment (where substrates are transferred to and from an interior volume of factory interface 106 that is external to the load locks) in some embodiments. In some embodiments, as shown in FIGS. 1B and 1C, load locks 120A-B are each a stacked load lock having one or more (e.g., a pair) of upper interior chambers and one or more (e.g., a pair) of lower interior chambers that are located at different vertical levels (e.g., one above another). In some embodiments, the one or more upper interior chambers are configured to receive processed substrates from transfer chamber 110 for removal from process tool 104, while the one or more lower interior chambers are configured to receive substrates from factory interface 106 for processing in process tool 104, or vice versa. In some embodiments, as shown in FIG. 1D, load locks 120A-B are each a batch load lock, which may be configured to hold and/or transfer multiple substrates (e.g., 25 substrates). In some embodiments, load locks 120A-B are configured to perform a substrate process (e.g., an etch or a pre-clean) on one or more substrates 102 received therein. Accordingly, load locks 120A-B may include one or more heating elements for heating the substrates and/or cooling elements for cooling the substrates.

Factory interface 106 can be any suitable enclosure, such as, e.g., an Equipment Front End Module (EFEM). Factory interface 106 can be configured to receive substrates 102 from substrate carriers 122A-F (e.g., Front Opening Unified Pods (FOUPs)) docked at various load ports 124 of factory interface 106. In a first example, as shown in FIG. 1A, factory interface 106 can include four load ports 124, which may be positioned at a front side of the factory interface 106 at one or more elevations. In a second example, as shown in FIGS. 1B, 2A, 2B, 2E, and 2F, factory interface 106 can include six load ports 124, which may be positioned at a front side of the factory interface 106 at one or more elevations. Factory interface 106 can be configured with any number of load ports 124, which may be located at one or more sides of the factory interface 106 and at the same or different elevations.

As shown in FIGS. 1B, 2A, 2B, and 2E, load ports 124 can be located at different elevations along the walls of factory interface 106. Elevating the load ports 124 allows for placement of one or more auxiliary components 150 at the base of factory interface 106. Auxiliary components 150 will be explained in more detail below. In some embodiments, as shown in FIGS. 1B, 2A, 2B, and 2E, one or more load ports 124 can be located at or near the factory interface base on the front side of factory interface 106, while one or more further load ports 124 can be located at a higher elevation (e.g., approximately two meters from the ground). In some embodiments, one or more substrate carrier elevator 113 can be configured to raise a substrate carrier 122A-F. In some embodiments, the substrate carrier elevator 113 can raise one or more substrate carriers 122A-F to an overhead automation component (not shown). The overhead automation component can deliver the one or more substrate carriers 122A-F to one or more an elevated load ports 124. Further, the overhead automation component can remove the one or more substrate carriers 112A-F from the one or more elevated load ports 124. In an example, a factory operator can load a substrate carrier 122A-F onto the substrate carrier elevator 113, engage the elevator to raise the substrate carrier 122A-F to the overhead automation component, engage the overhead automation component to deliver the substrate carrier 122A-F to a load port 124, then engage the overhead automation component to remove the substrate carrier 122A-F from the load port once empty, and engage the elevator to lower the substrate carrier 122A-F.

In some embodiments, at least one load port 124 may be positioned at a lower elevation that is accessible to factory operators who can manually load one or more substrate carriers 112A-F to said load port 124. One or more further load ports 124 may be positioned at a higher elevation, whereby the factory operators can engage the substrate carrier elevator 113 and the overhead automation component to load the one or more substrate carriers 112A-F to the elevated load ports 124. Such a configuration can allow for additional space at the base of the front side of the factory interface, whereby component placed in that space would not increase the operational footprint of the electronic device manufacturing system 100. For example, in some embodiments, auxiliary components 150 can be replaced with load ports 124. For example, four or six load ports 124 can be located at or near the factory interface base on the front side of factory interface 106. In some other embodiments, one or more load ports 124 can be loaded on a sidewall of factory interface 106.

One or more load ports 124 can be of a design that occupies a minimal amount of vertical space on the factory interface 106, according to aspects of the present disclosure. These load ports will be discussed in greater detail with respect to FIGS. 6A-6B and 7. In some embodiments, load ports 124 can be located at different elevations along the walls of factory interface 106. As discussed above, elevating the load ports 124 allows for placement of one or more of the auxiliary components 150 at the base of factory interface 106, below the load port(s) 124.

Factory interface robots 126A-B can be configured to transfer substrates 102 between substrate carriers (also referred to as containers) 122A-F and load locks 120A-B. In one embodiment, factory interface 106 includes two or more factory interface robots. For example, factory interface 106 may include a first factory interface robot 126A disposed within the factory interface at a first side (e.g., left-hand side) of the factory interface 106 and a second factory interface robot 126B disposed within the factory interface at a second side (e.g., right-hand side) of the factory interface 106. In one embodiment, the first and second load locks 120A, 120B are disposed within the factory interface 106 between the first and second factory interface robots 126A, 126B, with load lock 120A being closer to factory interface robot 126A and load lock 120B being closer to factory interface robot 126B.

In an example, factory interface robot 126A can be configured to transfer substrates 102 between a first set of substrate carriers (e.g., substrate carriers 122A-B, 122E) and load lock 120A. In another example, factory interface robot 126B can be configured to transfer substrates 102 between a second set of substrate carriers (e.g., substrate carriers 122C-D, 122-F) and load lock 120B. However, it is noted that factory interface robots 126A-B can be configured to transfer substrates 102 between any of the substrate carriers 122A-F and load locks 120A-B. In other and/or similar embodiments, factory interface 106 is configured to receive replacement parts from replacement parts storage containers, and factory interface robots 126A-B are configured to transport such replacement parts into and out of one or more of the load locks 120A-B. In some embodiments, factory interface robot 126A cannot access load lock 120B and factory interface robot 128B cannot access load lock 120A.

Factory interface robots 126A-B can include one or more robot arms and can each be or include a SCARA robot, a mast-type robot, a lift-type (e.g., scissor lift) robot, or any combination thereof. In some embodiments, factory interface robots 126A-B has more links and/or more degrees of freedom than transfer chamber robot 112. Each of the factory interface robots 126A-B may include actuators or assemblies that can adjust a height of one or more of the robot arms of the respective factory interface robots 126A-B, enabling the factory interface robots 126A-B to reach carriers connected to load ports at different elevations. Factory interface robots 126A-B can each include one or more end effectors on an end of each robot arm. The end effector(s) can be configured to pick up and handle specific objects, such as wafers. Alternatively, or additionally, the end effector(s) can be configured to handle objects such as process kit rings. Any conventional robot type can be used for factory interface robots 126A-B. Transfers can be carried out in any order or direction. The factory interface robots 126A-B will be discussed in greater detail with respect to FIGS. 8 and 9A-9C.

Factory interface 106 can be maintained in, e.g., a slightly positive-pressure non-reactive gas environment (using, e.g., nitrogen as the non-reactive gas) in some embodiments. In embodiments, factory interface 106 includes an environmental control system with one or more inert gas delivery line, one or more exhaust line, and one or more sensors usable to measure one or more of humidity, O2 level, temperature, pressure, gas flow rates, and/or other parameters. The environmental control system may adjust the gases and/or rates of gases flowed into the factory interface and/or the rates of gases exhausted from the factory interface based on the one or more measured parameters. In embodiments, the factory interface further includes a recirculation system that may filter gases exhausted from the factory interface and recirculate the filtered gasses back into the interior of the factory interface.

Each of load locks 120A-B can include one or more slit valves and/or doors configured to open when receiving or releasing substrates to and/or from factory interface robots 126A-B and transfer chamber robot 112. The slit valves and/or doors may be used to maintain a vacuum environment, a clean environment, and/or a temperature controlled environment. For example, the slit values and/or doors may be used to maintain a vacuum environment within the transfer chamber 110 and an inert gas environment within factory interface 106. Load lock 120A can include one (as shown in FIG. 1D) or multiple (as shown in FIG. 1C) side doors 128A which can grant access to factory interface robot 126A. Load lock 120B can include one or more side doors 128B which can grant access to factory interface robot 126B. Load locks 120A-B can include one or more front doors (not shown) which grant access to transfer chamber robot 112.

As shown, in one embodiment side door 128A is approximately perpendicular to a backside of factory interface 106, and is also approximately perpendicular to door 130. Similarly, in one embodiment side door 128B is approximately perpendicular to the backside of factory interface 106, and is also approximately perpendicular to door 130. Side door 128A may face an opposite direction to side door 128B. Though not shown, one or more additional side doors may be included in load locks 120A, 120B, where the one or more additional side doors are between and separate the load locks 120A-B. For example, an additional side door of load lock 120B may be on an opposite side of side door 128B, and may be opened to permit factory interface robot 126B to place substrates in load lock 120A, to permit factory interface robot 126A to place substrates in load lock 120B, and/or to permit handoff of substrates between factory interface robot 126A and factory interface robot 126B.

In some embodiments, factory interface robots 126A-B may orient end effectors in a first direction that is pointed towards and approximately perpendicular to a front side of the factory interface when retrieving substrates from and/or placing substrates in containers 122A-F. In embodiments, factory interface robot 126A may orient one or more end effectors in a second direction that may be approximately perpendicular to the first direction when retrieving substrates from and/or placing substrates in load lock 120A. Similarly, factory interface robot 126B may orient one or more end effectors in a third direction that may be approximately perpendicular to the first direction when retrieving substrates from and/or placing substrates in load lock 120B. Third direction may be approximately 180 degrees from the second direction in embodiments.

In some embodiments, transfer chamber 110, process chambers 114, 116, and 118, and/or load locks 120A-B are maintained at a vacuum level. Electronic device manufacturing system 100 can include one or more vacuum ports that are coupled to one or more stations of electronic device manufacturing system 100. For example, vacuum ports 130 can be coupled to load locks 120A-B and disposed between load locks 120A-B and transfer chamber 110. In some embodiments, additional vacuum ports can be used. For example, further vacuum ports (not shown) can couple factory interface 106 to load locks 120A-B. In some embodiments, a factory operator can access load locks 120A-B for maintenance or repair without shutting down factory interface 106. This will be discussed in further detail below.

In some embodiments, one or more utility lines (not shown) are configured to provide utilities to factory interface 106. The utility lines can include a power utility line configured to provide power to factory interface 106, an air utility line configured to provide air to factory interface 106 (e.g., a clean dry air (CDA) utility line), a vacuum utility line configured to provide a vacuum to vacuum ports 130 and/or to the interior chamber of the factory interface 106, and/or a nitrogen utility line configured to provide nitrogen to factory interface 106.

One of more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, a nitrogen supply, etc.). In some embodiments, the outlet of a utility supply is connected to the floor (or a wall) of electronic device manufacturing system 100. As such, the first end of each utility cable can be mounted to the ground of the fab (e.g., the ground over which the factory interface 106 is installed). A second end of each utility cable can be mounted to an inlet of factory interface 106. In some embodiments, the inlet is located at a bottom of factory interface 106. As such, the second end of each utility cable is mounted to the bottom of factory interface 106.

Electronic device manufacturing system 100 can also include a system controller 140. System controller 140 can be and/or include a computing device such as a personal computer, a server computer, a programmable logic controller (PLC), a microcontroller, and so on. System controller 140 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 140 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 140 may include an environmental controller configured to control an environment (e.g., pressure, moisture level, vacuum level, etc.) within factory interface 106. In embodiments, execution of the instructions by system controller 140 causes system controller to perform the methods of one or more of FIGS. 11 and 12. System controller 140 can also be configured to permit entry and display of data, operating commands, and the like by a human operator.

Referring now to FIGS. 1A-B, in some embodiments, factory interface robot 126A is configured to transfer one or more substrate to factory interface robot 126B, or vice-versa, using a pass through area 115A, 115B, 115C. In a first example, a pass through area 115A can be disposed between a front side of the factory interface and a front-facing side of the load locks, as shown in FIG. 1A. In a second example, a pass through area 115B can be a via or open space disposed within the interior volume of the factory interface 106 above load locks 120A-B. In a third example, a pass through area 115C can be an open space or a via disposed within the interior volume of factory interface 106 between a pair of upper interior chambers and a pair of lower interior chambers of load locks 120A-B (e.g., where load locks 120A-B are each a stacked load lock). In a fourth example, a pass through area 115D can be an open space or a via disposed within the interior volume of the factory interface 106 below load locks 120A-B. Factory interface robot 126A can be configured to transfer one or more substrates to the factory interface robot 126B through one or more of pass through areas 115A-D in embodiments.

Figure 3:
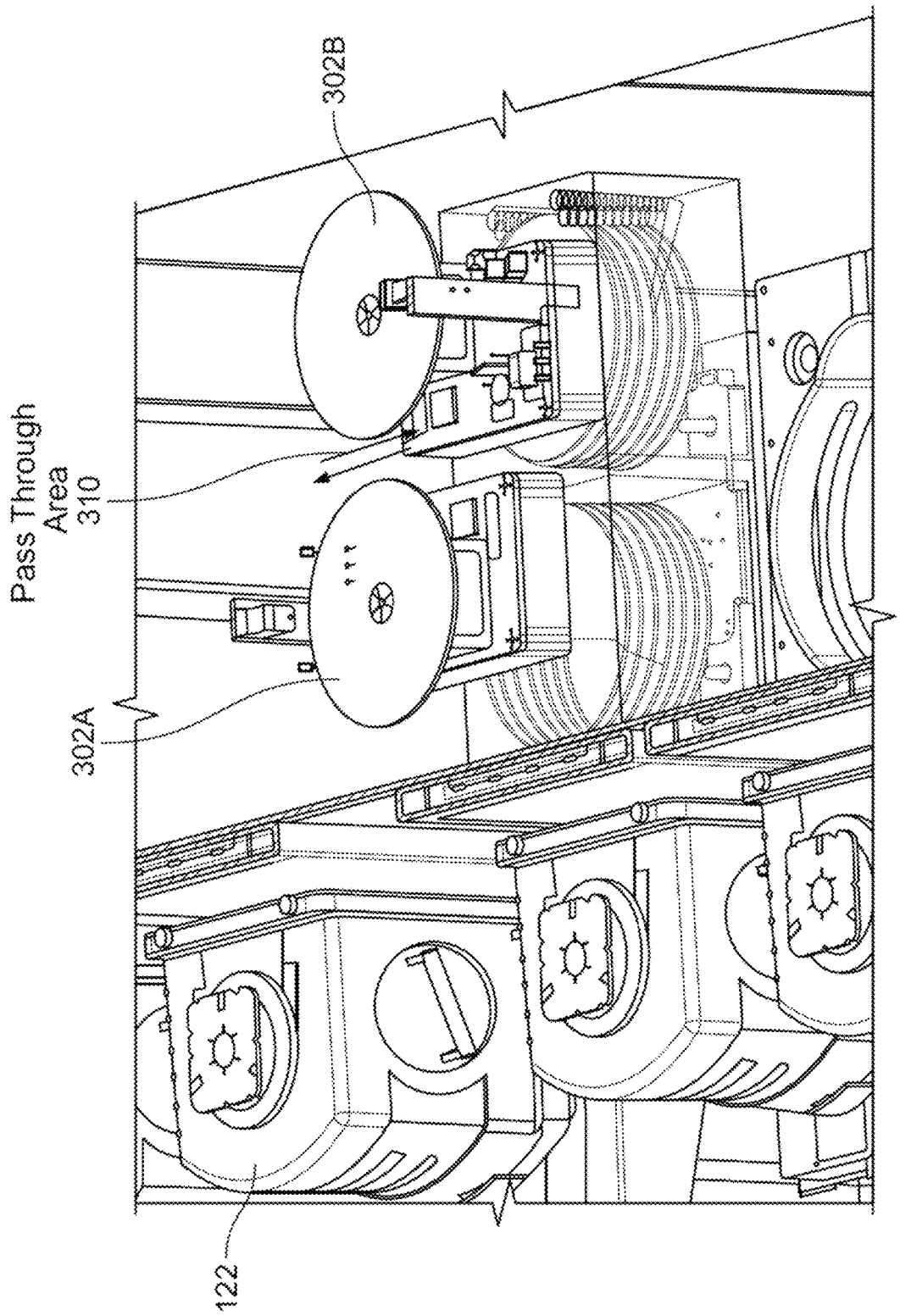
FIG. 3 is an illustration of a handoff between two factor interface robots, according to aspects of the present disclosure.

In some embodiments, factory interface robot 126A can hand-off the substrate(s) to factory interface robot 126B, and vice versa. For example, as illustrated in FIG. 3, substrates 302A-B can be handed off between factory interface robots 126A-B (not shown) using pass through area 310. In some embodiments, factory interface robot 126A can place the substrate(s) on a shelf in any of the pass through areas 115A-D that are included in the factory interface, and factory interface robot 126B can retrieve the substrate(s) from the shelf.

Referring to FIGS. 1B-D, 2A-2B, and 2D-2E, factory interface 106 can include one or more auxiliary components 150 that are accessible by the factory interface robots and are part of the factory interface mini-environment. The auxiliary components 150 can include substrate wafer storage stations, metrology stations, cooldown stations, servers, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include upper compartment 160, as seen in FIGS. 1B and 2A-E. Upper compartment 160 can house electronic systems (e.g., servers, air conditioning units, etc.), utility cables, system controller 140, or other components.

Factory interface 106 can include one or more access doors 134, 136, which may be used to inspect or perform maintenance on load locks 120A-B, factory interface robots 126A-B, or other components. In some embodiments, factory interface can include side access doors 134. In some embodiments, factory interface 106 can include front access door 136. Load locks 120A-B can be insulated from the clean environment generated by factory interface 106 by way of side doors 128A-B. This allows the factory operator to access load locks 120A-B without shutting down the clean environment generated by factory interface 106.

In the illustrated embodiments of FIGS. 1A, 1C, and 1D, there is an open space (e.g., pass through area 115A) between a front of the factory interface and a front of the load locks 120A-B. In alternative embodiments, the load locks 120A, 120B may extend all the way to the front of the factory interface 106. In such an embodiment, the load locks may be accessed without exposing the interior volume of the factory interface 106 to an external environment. In an embodiment, load locks 120A, 120B include additional access doors (not shown) that are on opposite sides of the load locks to doors 130. Such access doors may be opened while doors 130, 128A, 128B are closed to enable maintenance access to the load locks 120A-B without exposing the interior of the factory interface 106 to an external environment.

In some embodiments, as shown in FIGS. 1B, 2A-B, and 2E, factory interface 106 can include under access area 170. Under access area 170 can be a channel that allows a factory operator to provide maintenance for factory interface 106, load locks 120A-B, factory interface robots 126A-B, transfer chamber 108, and/or other components of the electronic device manufacturing system 100. In some embodiments, in which the factory interface includes under access area 170, load locks 120A, 120B include maintenance access doors on an underside of the load locks 120A, 120B, which are reachable from the under access area 170.

In a descriptive example, factory interface 106 includes a plurality of sides which comprise a back side that is configured to face transfer chamber 110 of the electronic device manufacturing system 100, a front side, a right side and a left side. A first factory interface robot (e.g., factory interface robot 126A) is disposed within the interior volume proximate to the left side, and a second factory interface robot (e.g., factory interface robot 126B) is disposed within the interior volume proximate to the right side. A first load lock (e.g., load lock 120A) and a second load lock (e.g., load lock 120B) are disposed adjacent to the back side and between the first factory interface robot and the second factory interface robot such that the first load lock is nearer to the first factory interface robot than the second load lock and the second load lock is nearer to the second factory interface robot than the first load lock. Factory interface 106 includes a first set of load ports (e.g., one or more of load ports 122) for receiving the first set of substrate carriers (e.g., one or more of substrate carriers 122A-F), where the first set of load ports are positioned at a first portion of the front side that is proximate to the left side. Factory interface 106 also includes a second set of load ports (e.g., one or more of load ports 122) for receiving the second set of substrate carriers (e.g., one or more of substrate carriers 122A-F), where the second set of load ports are positioned at a second portion of the front side that is proximate to the right side. Factory interface 106 can include at least one of a substrate storage container or metrology equipment positioned below a load port 122 of the first set of load ports. The plurality of sides can include a back side that is configured to face transfer chamber 110, a right side and a left side, where the first factory interface robot is disposed within the interior volume proximate to the left side, and the first load lock is disposed adjacent to the back side and between the first factory interface robot and the right side. The first load lock can include a first door (e.g., side door 128A) that is approximately perpendicular to the back side and accessible by the first factory interface robot, and a second door that is approximately parallel to the back side and accessible by transfer chamber robot 112.

Figure 4A:
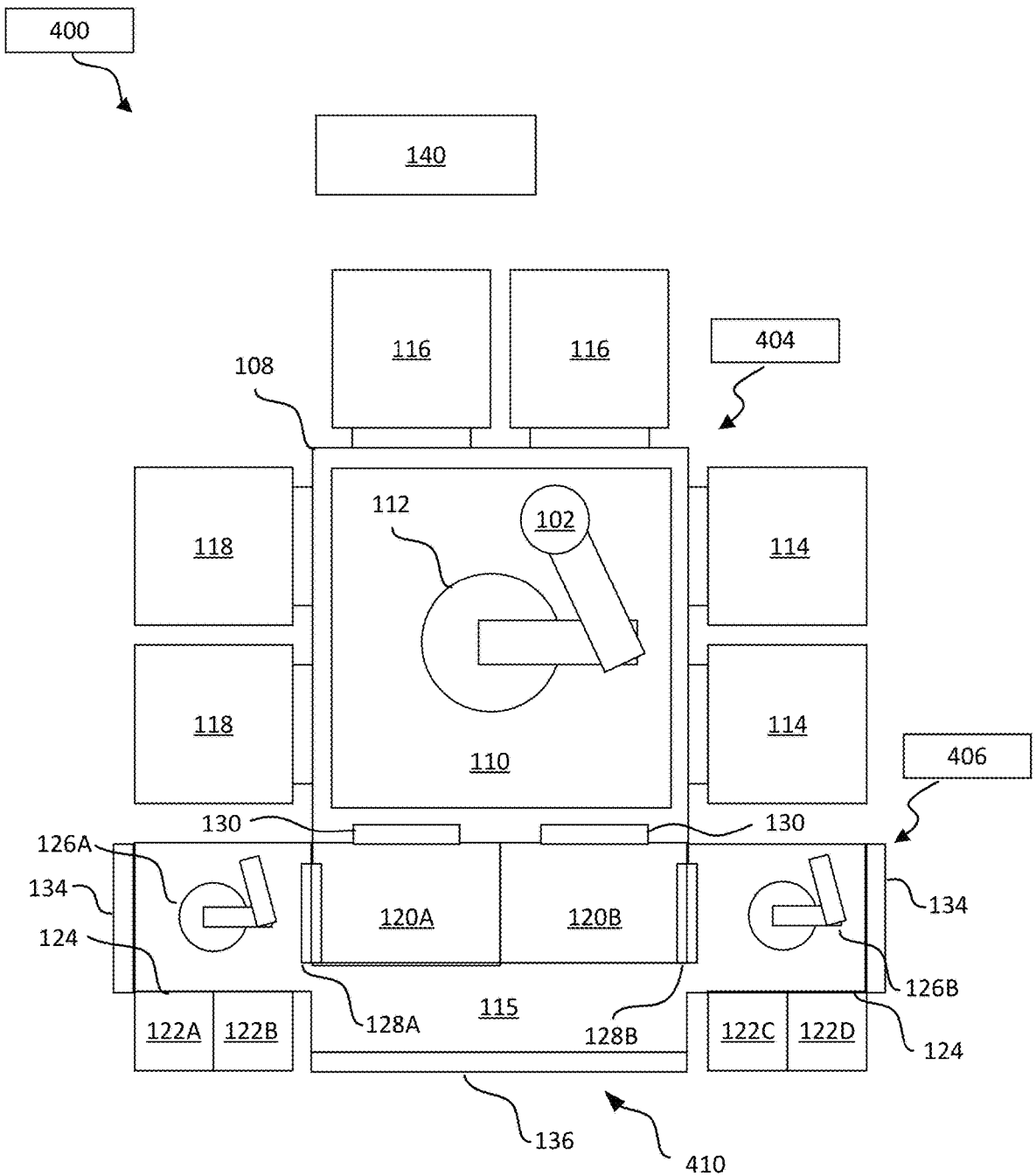
FIG. 4A is a top schematic view of another example electronic device manufacturing system, according to aspects of the present disclosure.
Figure 4B:
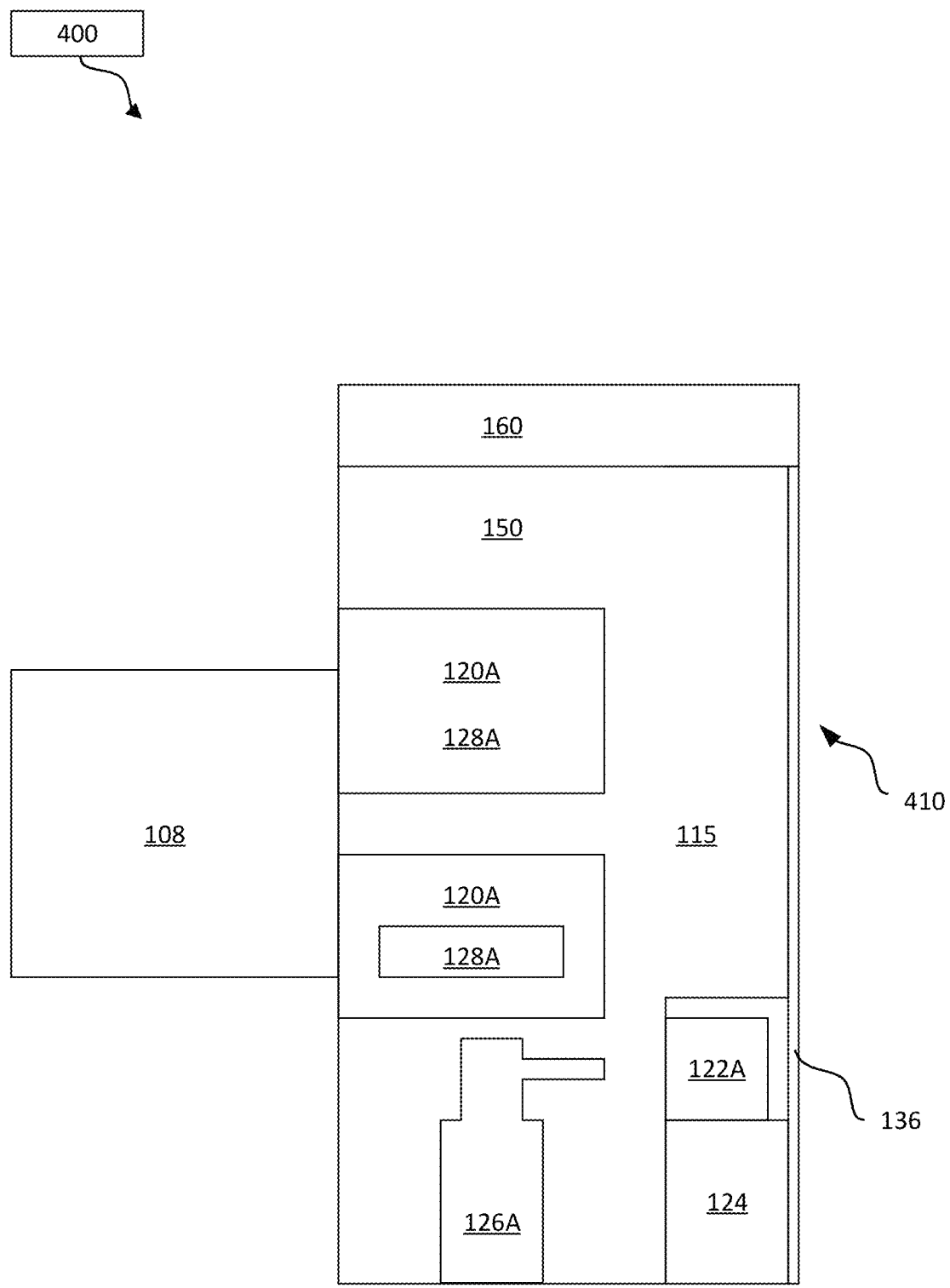
FIG. 4B is a side schematic view of another example electronic device manufacturing system, according to aspects of the present disclosure.

FIG. 4A is a top schematic view of an electronic device manufacturing system 400 including process tool 404 and a factory interface 406 coupled to process tool 404, in accordance with one embodiment of the present disclosure. The components and functions of process tool 404 and factory interface 406 may be similar to process tool 104 and factory interface 406, respectively. FIGS. 4A-B describes an example electronic device manufacturing system 400 similar to that described with reference to FIGS. 1A-1D, but where factory interface 406 includes bulged section 410 at a front side of the factory interface 106. FIG. 4A is a top schematic view of the example electronic device manufacturing system 400, according to aspects of the present disclosure. FIG. 4B is a side schematic view of the example electronic device manufacturing system 400, according to aspects of the present disclosure. Bulged section 410 can provide for additional space within factory interface 406. Bulged section 410 can extend any length away from load locks 120A-B, and can have a top section (e.g., a ceiling) with a height independent of the height of the remainder of factory interface 406. For example, the height of the top section of bulged section 410 can be one meter, two meters, the same height as the top section of factory interface 406, a height taller than the top section of factory interface 406, or some other height. In some embodiments, bulged section 410 may extend to the ends of the substrate carriers 122A-D to not increase the operational footprint of factory interface 406. Thus, in embodiments a front face of the bulged section 410 can be approximately flush with a front of carriers 122A-F. In some embodiments, bulged section 410 provides factory interface 406 with additional space for housing various components, such as, but not limited to, substrate storage containers, metrology equipment, servers, air conditioning units, etc. Bulged section 410 can share the clean environment of factory interface 406.

In some embodiments, factory interface robot 126A can be configured to transfer one or more substrate to factory interface robot 126B, or vice-versa, using a pass through area 115 disposed within bulged section 410. For example, factory interface robot 126A can hand-off the substrate(s) to factory interface robot 126B using the pass through area disposed within bulged section 410. In another example, factory interface robot 126A can place the substrate(s) on a shelf in the pass through area disposed within bulged section 410, and factory interface robot 126B can retrieve the substrate(s) from the shelf.

In some embodiments, the load locks are not included within the factory interface. In such embodiments, the factory interface may be split into two or more factory interfaces (e.g., a left and right factory interface). The load locks may then be positioned between the left and right factory interfaces. This may reduce the total combined footprint of the factory interface and the load locks in the same manner as the embodiments described above.

In a descriptive example, a front side of the factory interface 406 can include a center portion (e.g., bulged section 410), a left front portion, and a right front portion, where the center portion protrudes away from the left front portion, the right front portion, and the back side, where a first load port (e.g., one of load ports 122) is positioned at a first position on the front left portion, and a second load port (e.g., another one of load ports 122) is positioned at a second position on the front right portion. A via disposed within the interior volume of the factory interface 406 at the center portion can be used by a first factory interface robot (e.g., factory interface robot 126A) configured to transfer a substrate to a second factory interface robot (e.g., factory interface robot 126B) through the via.

Figure 5A:
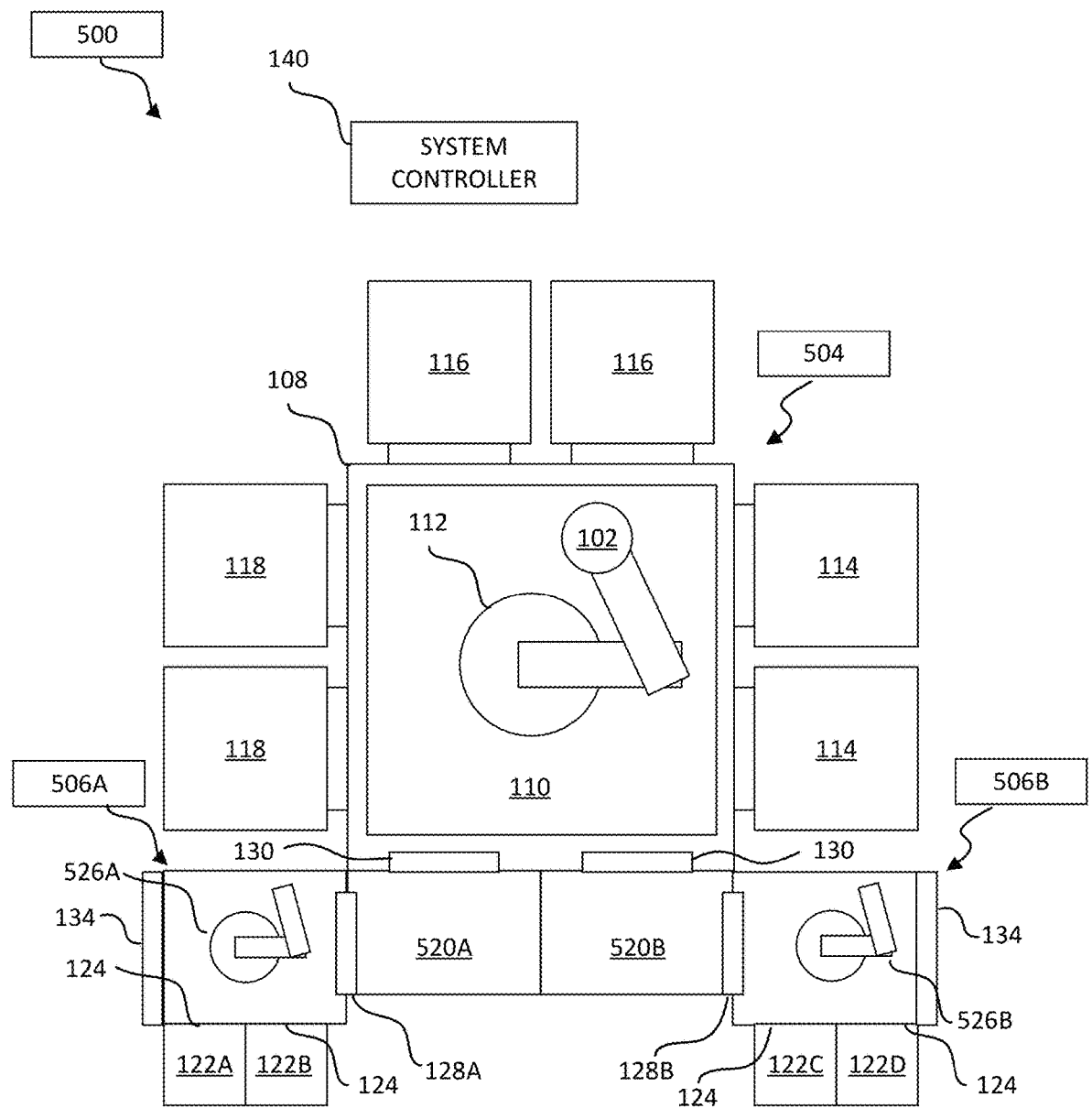
FIG. 5A is a top schematic view of yet another example electronic device manufacturing system, according to aspects of the present disclosure.
Figure 5B:
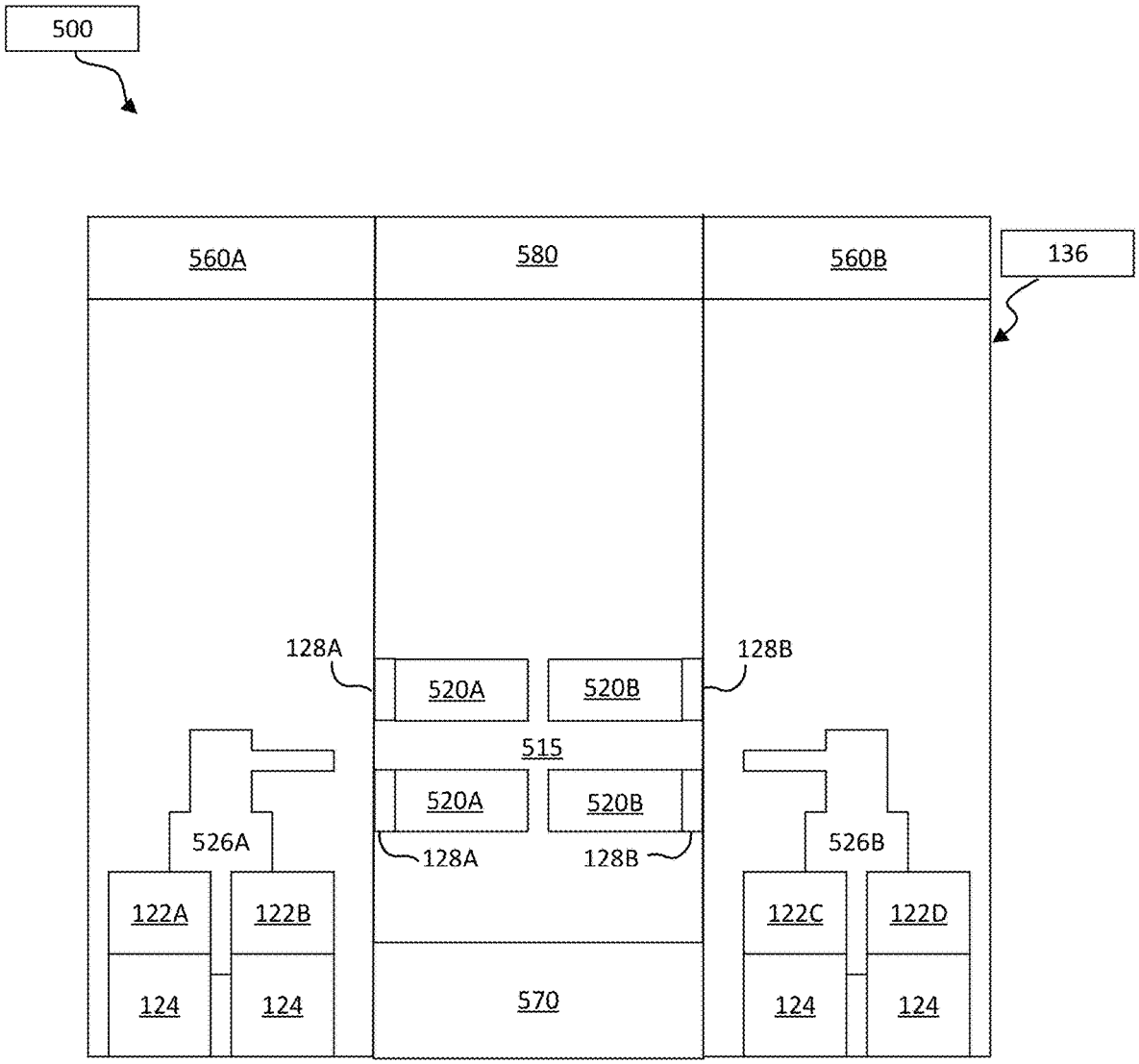
FIG. 5B is a front schematic view of the yet another example electronic device manufacturing system, according to aspects of the present disclosure.

FIGS. 5A-5B describe an electronic device manufacturing system 300 where a first load lock (e.g., load lock 120A) is connected to a first factory interface (e.g., factory interface 506A) and a second load lock (e.g., load lock 120B) is connected to a second factory interface (e.g., factory interface 506B). FIG. 5A is a top schematic view of example electronic device manufacturing system 500, according to aspects of the present disclosure. FIG. 5B is a front schematic view of example electronic device manufacturing system 500, according to aspects of the present disclosure.

Electronic device manufacturing system 500 includes a process tool 504, load locks 520A-B coupled to process tool 504, and factory interfaces 506A-B, where factory interface 506A is coupled to load lock 520A, and factory interface 506B is coupled to load lock 520B. The components and functions of process tool 504, load locks 520A-B, and factory interfaces 506A-B may be similar to process tool 104, load locks 120A-B, and factory interface 106, respectively.

Load locks 520A-B can be coupled to housing 108 and transfer chamber 110. Load locks 520A-B can be configured to interface with transfer chamber 110 and factory interfaces 506A-B. Load locks 520A-B can have an environmentally-controlled atmosphere that is changed from a vacuum environment (where substrates are transferred to and from transfer chamber 110) to an at or near atmospheric-pressure inert-gas environment (where substrates are transferred to and from factory interfaces 506A-B) in some embodiments. In some embodiments, load locks 520A-B are each a stacked load lock having a pair of upper interior chambers and a pair of lower interior chambers that are located at different vertical levels (e.g., one above another). In some embodiments load locks 520A-B are each a batch load lock. More or fewer load locks may be used than the number shown.

Similar to factory interface 106, each of factory interfaces 506A-B can be any suitable enclosure, such as, e.g., an Equipment Front End Module (EFEM). Factory interface 506A can be configured to receive substrates 102 from substrate carriers 122A-B docked at various load ports 124 of factory interface 506A. Note that while two substrate carriers 122A-B are shown, more or fewer substrate carriers may be connected to factory interface 506A. Factory interface 506B can be configured to receive substrates 102 from substrate carriers 122C-D docked at various load ports 124 of factory interface 506B. Note that while two substrate carriers 122C-D are shown, more or fewer substrate carriers may be connected to factory interface 506B. Load ports 124 and the attached substrate carriers can be located at different elevations along the walls of factory interface 106. Elevating the load ports 124 allows for placement of one or more auxiliary components (not shown) at the base of factory interfaces 106 and/or allows multiple substrate carriers to be stacked vertically.

Factory interface robots 526A-B can be similar to factory interface robots 126A-B, respectively, and can be configured to transfer substrates 102 between substrate carriers 122A-D and load locks 520A-B. For example, factory interface robot 526A can be configured to transfer substrates 102 between substrate carriers 122A-B and load lock 520A, and factory interface robot 526B can be configured to transfer substrates 102 between substrate carriers 122C-D and load lock 520B. In one embodiment, factory interface 506A includes one or more factory interface robots, and factory interface 506B includes one or more factory interface robots. For example, factory interface 506A may include a first factory interface robot 526A disposed within factory interface 506A and factory interface 506B may include a second factory interface robot 526B disposed within factory interface 506B. In one embodiment, the first and second load locks 520A, 520B are disposed between the first and second factory interface robots 526A, 526B, with load lock 520A being closer to factory interface robot 526A and load lock 520B being closer to factory interface robot 526B.

A first vacuum port (not shown) can couple factory interface 506A to load lock 520A and a second vacuum port can couple factory interface 506B to load lock 520B. The atmosphere of each load lock 520A-B can regulated independent of the other load lock 520A-B. This allows a factory operator to access one load lock and factory interface for maintenance or repair while the other load lock and factory interface remains operational.

Factory interface 106 can include one or more auxiliary components 150. The auxiliary components 150 can include substrate storage containers, metrology equipment, servers, air conditioning units, etc. A substrate storage container can store substrates and/or substrate carriers (e.g., FOUPs). Metrology equipment can be used to determine property data of the products that were produced by the electronic device manufacturing system 100.

In some embodiments, factory interface 506A can include upper compartment 560A, as seen in FIG. 5B, factory interface 506B can include upper compartment 560B, and load locks 520A-B may include middle compartment 580 and lower compartment 570. Each of these compartment can house one or more electronic systems (e.g., servers, air conditioning units, etc.), utility cables, system controller 140, or other components.

As shown, in one embodiment side door 128A is approximately perpendicular to a backside of factory interface 506A, and is also approximately perpendicular to door 150. Similarly, in one embodiment side door 128B is approximately perpendicular to the backside of factory interface 506B, and is also approximately perpendicular to door 150. Side door 128A may face an opposite direction to side door 128B. Though not shown, one or more additional side doors may be included in load locks 520A-B, where the one or more additional side doors are between and separate the load locks 520A-B. For example, an additional side door of load lock 520B may be on an opposite side of side door 528B, and may be opened to permit factory interface robot 526B to place substrates in load lock 520A, to permit factory interface robot 526A to place substrates in load lock 520B, and/or to permit handoff of substrates between factory interface robot 526A and factory interface robot 526B.

In embodiments, factory interface robots 526A-B may orient end effectors in a first direction that is pointed towards and approximately perpendicular to a front side of the factory interface when retrieving substrates from and/or placing substrates in containers 122A-D. In embodiments, factory interface robot 526A may orient one or more end effectors in a second direction that may be approximately perpendicular to the first direction when retrieving substrates from and/or placing substrates in load lock 520A. Similarly, factory interface robot 526B may orient one or more end effectors in a third direction that may be approximately perpendicular to the first direction when retrieving substrates from and/or placing substrates in load lock 520B. Third direction may be approximately 180 degrees from the second direction in embodiments.

Load locks 520A-520B may be accessed without exposing the interior volume of the factory interfaces 506A-B to an external environment. In an embodiment, load locks 520A, 520B include additional access doors (not shown) that are on opposite sides of the load locks to doors 150. Such access doors may be opened while doors 150, 128A, 128B are closed to enable maintenance access to the load locks 520A-B without exposing the interior of the factory interfaces 506A-B to an external environment.

Referring now to FIG. 5B, in some embodiments, the factory interface robot 526A can be configured to transfer one or more substrate to factory interface robot 526B, or vice-versa, using a pass through area 515. In an example, the pass through area 515 can be a via between the pair of upper interior chambers and a pair of lower interior chambers of load locks 520A-B (e.g., where load locks 120A-B are each a stacked load lock). In some embodiments, the pass through area 515 may be a part of the environmentally-controlled atmosphere that is changed from a vacuum environment (where substrates are transferred to and from transfer chamber 110) to an at or near atmospheric-pressure inert-gas environment (where substrates are transferred to and from an interior volume of factory interface 106 that is external to the load locks). For example, the pass through area 515 may be part of an environmentally controlled area of one or more of the load locks, or may have its own separate environmentally controlled area. In one embodiment in which the pass through area 515 is between the upper interior chambers and the lower interior chambers, the pass through area is included within an enclosure containing the load locks, and includes slit valves that can be used to seal off the pass through area 515 from the environment of the factory interface. Alternatively, the pass through area 515 may be exposed to and/or part of an environment of the factory interface. Alternatively, or additionally, vias may be positioned above and/or below the load locks, and may provide pass through areas between the factory interfaces 506A-506B. In some embodiments, either or both of the vias positioned above and/or below the load locks may be a part of the environmentally-controlled atmosphere of one or more of the load locks. Factory interface robot 526A can be configured to transfer one or more substrates to the factory interface robot 526B through the any of the pass through areas, and vice versa. In some embodiments, factory interface robot 526A can hand-off the substrate(s) to factory interface robot 526B. In some embodiments, factory interface robot 526A can place the substrate(s) on a shelf in the pass through area, and factory interface robot 526B can retrieve the substrate(s) from the shelf.

In a descriptive example, electronic device manufacturing system 500 includes a transfer chamber 110, a plurality of processing chambers connected to the transfer chamber 114, 116, 118, a first load lock (e.g., load lock 520A) having a first side and a second side that is approximately perpendicular to the first side of the first load lock, where the first side of the first load lock is connected to the transfer chamber 110. Further, the electronic device manufacturing system 500 includes a second load lock (e.g., load lock 520B) having a first side and a second side that is approximately perpendicular to the first side of the second load lock, where the first side of the second load lock is connected to the transfer chamber 110. A first factory interface 506A is connected to the second side of the first load lock, and a second factory interface 506B is connected to the second side of the second load lock. The first factory interface 506A can include a first atmospheric environment and the second factory interface 506B can include a second atmospheric environment.

Figure 6A:
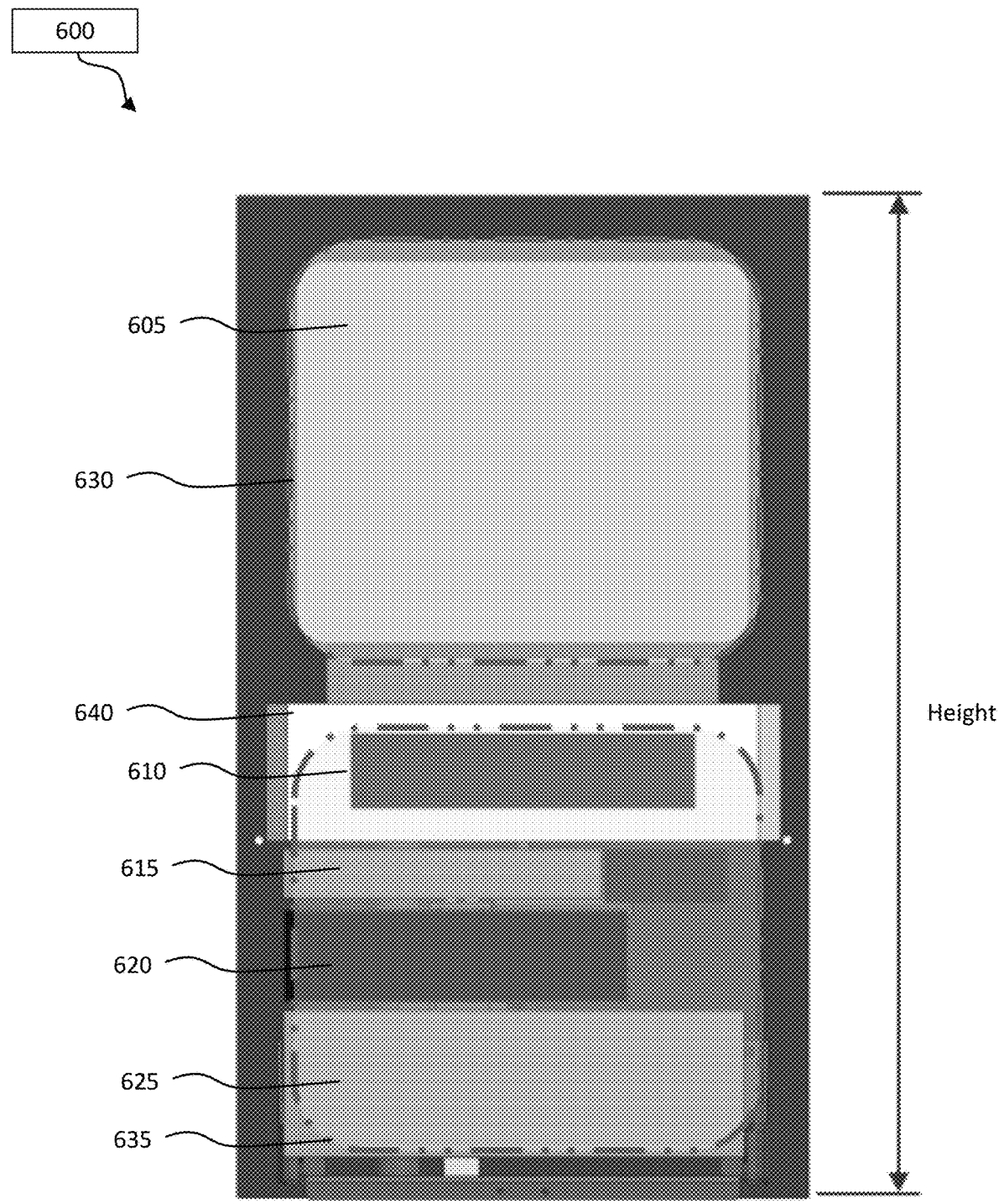
FIG. 6A is a front schematic view of an example load port, according to aspects of the present disclosure.
Figure 6B:
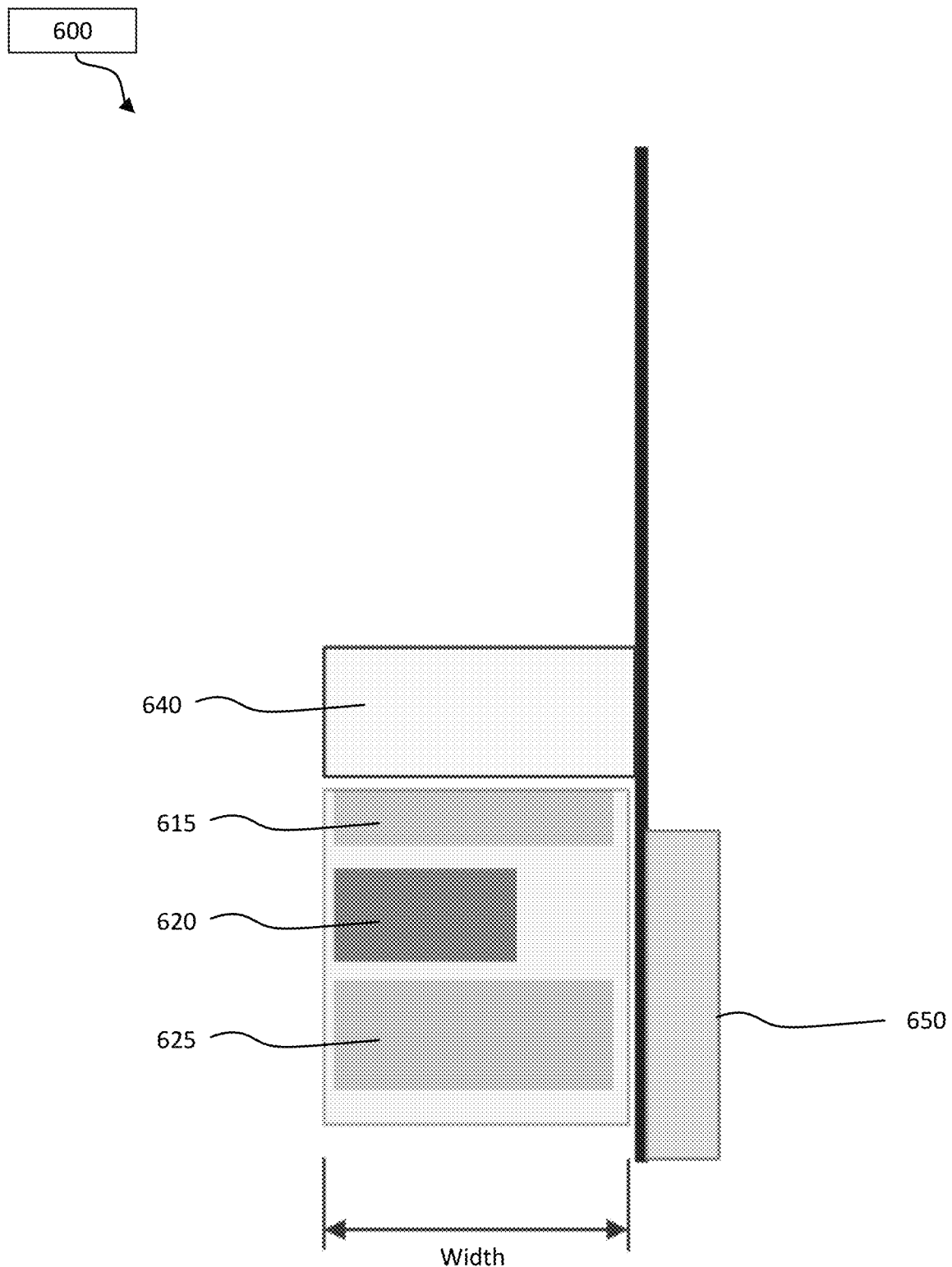
FIG. 6B is a side schematic view of an example load port, according to aspects of the present disclosure.

FIGS. 6A-6B describe an example load port 600 including indicator light 610, load port controller 615, pneumatic control 620, purge kit 625, and stage 640 in accordance with one embodiment of the present disclosure. The component and functions of load port 600 can be similar to load port 124. FIG. 6A is a front schematic view of the example load port 600, in accordance with one embodiment of the present disclosure. FIG. 6B is a side schematic view of the example load port 600, in accordance with one embodiment of the present disclosure.

As illustrated in FIG. 6A, a load port door 605 can be positioned in closed position 630 to secure to an transport opening to maintain environmentally-controlled atmosphere in the factory interface 106. The load port door 605 can be positioned in open position 635 using a door mechanism, as will be described in greater detail in FIG. 7. While in the open position 635, the transport opening in load port 600 enables substrates (e.g., wafers) to be transferred between a substrate carrier 122 coupled to load port 600 and factory interface 106 using a factory interface robot 126. In some embodiments, the load port door 605 can couple to the substrate carrier door. As such, responsive to the load port door 605 being positioned to the open position 635, the load port door 605 can remove the substrate carrier door from the substrate carrier. Accordingly, responsive to the load port door 605 being positioned to the closed position 630, the load port door 605 can attach the substrate carrier door to the substrate carrier.

Load port 600 can be designed to occupy a minimal amount of vertical space on the factory interface 106. In some embodiments, the height of load port 600 can be correlated to the vertical space occupied by the load port door 605 in the open position 630 and in the closed position 635. In particular, the height of load port 600 can be approximately twice the height of load port door 605. By way of illustrative example, load port door 605 can have a height of approximately 315 millimeters. Accordingly, load port 600 can have a height of approximately 650 millimeters or less, which is approximately twice the height of load port door 605, and significantly less than the over 1300 millimeter height of conventional load ports. As illustrated by way of exemplary example in FIG. 6B, load port 600 can have a width of approximately 450 millimeters or less. Load port 600 can comply with SEMI (Semiconductor Equipment and Materials International) standards and requirements.

Indicator light 610 can indicate whether load port door 605 is in the closed position 635 or in the open position 630. For example, indicator light 610 can be turned on in response to the load port door 605 being in the open position 630, and turned off in response to the load port door 605 being in the closed position 630. In other embodiments, indicator light 610 can indicate whether a substrate carrier 122 is properly secured to the load port 600.

Load port controller 615 can be and/or include a computing device such as a programmable logic controller (PLC), a microcontroller, and so on. Load port controller 615 can include one or more processing devices, which can be general-purpose processing devices such as a microprocessor, central processing unit, or the like. Load port controller 615 can include a data storage device (e.g., one or more disk drives and/or solid state drives), a main memory, a static memory, a network interface, and/or other components. Load port controller 615 can execute instructions to perform any one or more of the methodologies and/or embodiments described herein. For example, load port controller 615 can operate the load port door (e.g., position the load port door 605 into the open position 635, position the load port door 605 into the closed position 630), turn on/off indicator light 610, activate and deactivate and/or communicate with pneumatic control 620, purge kit 625, particle trapping mechanism 650, etc. The instructions can be stored on a computer readable storage medium, which can include the main memory, static memory, secondary storage and/or processing device (during execution of the instructions). In embodiments, execution of the instructions by load port controller 615 can perform, at least in part, the methods of FIG. 11. Load port controller 615 can also be configured to permit entry and display of data, operating commands, and the like by a human operator or by system controller 140. In some embodiments, load port controller 615 can include a radio frequency identification (RFID) system to perform automatic lot identification during the substrate loading and unloading process.

Pneumatic control 620 can operate a pneumatic device or a similar mechanism by using differential pressures and/or flows to push flexible diaphragms connected to mechanical values and similar devices to operate switches, open or close valves, move dampers, etc. By way of example, pneumatic control 620 can operate the pneumatic device using compressed air or gasses. The pneumatic device can be coupled to load lock door 605. Pneumatic control 620 can receive instructions from and/or be operated by load port controller 615. For example, load port controller 615 can command pneumatic control 620 to position load port door 605 into the open position 635 and into the closed position 630.

Purge kit 625 allows for purging of a substrate carrier 122 with nitrogen (N2) or any other practicable inert gas such as argon when the substrate carrier 122 is being processed by the electronic device manufacturing system 100. Purge kit 625 can include one or more inter-substrate purge nozzle arrays, one or more curtain nozzle arrays, etc. The combination of the gas flows from the nozzle arrays can be controlled by load port controller 615 to achieve an optimum purge of the substrate carrier 122. Stage 640 can horizontally protrude from the load port 600 and can support a placement of substrate carriers 122.

Load port 600 can have one or more sets of mounting holes to couple load port 600 to the factory interface 106. By way of illustrative example, load port 600 can include two sets of mounting holes. For example, a first pair of mounting holes can be located at the front upper corners of load port 600, and a second pair of mounting holes can be located at the front lower corner of load port 600. By way of comparison, conventional load ports require three sets of mounting holes (a top set, a middle set, and a bottom set). Thus, load port 600 can be coupled to a wall of the factory interface 106 using fewer fasteners (e.g., bolts, screws, rivets, etc.). In some embodiments, load port 600 can be mounted onto a wall of the factory interface 106 using one or more mounting racks. Mounting load port 600 can comply with SEMI standards and requirements.

As illustrated in FIG. 6B, load port 600 can include particle trapping mechanism 650. Particle trapping mechanism 650 can be any type of component or mechanism designed to catch particles (e.g., dust particles) generated by the motion of load port door 605, by purge kit 625, etc. Thus, particle trapping mechanism 650 can prevent particles from the substrate carrier 122 from contaminating the factory interface 106. In some embodiments, the particle trapping mechanism 650 can be positioned at or around the lower lip of the load port 600 opening. In some embodiments, particle trapping mechanism 650 can include an exhaust system. The exhaust system can guide collected particles out of the factory interface 106, into a collection mechanism, etc.

Figure 7:
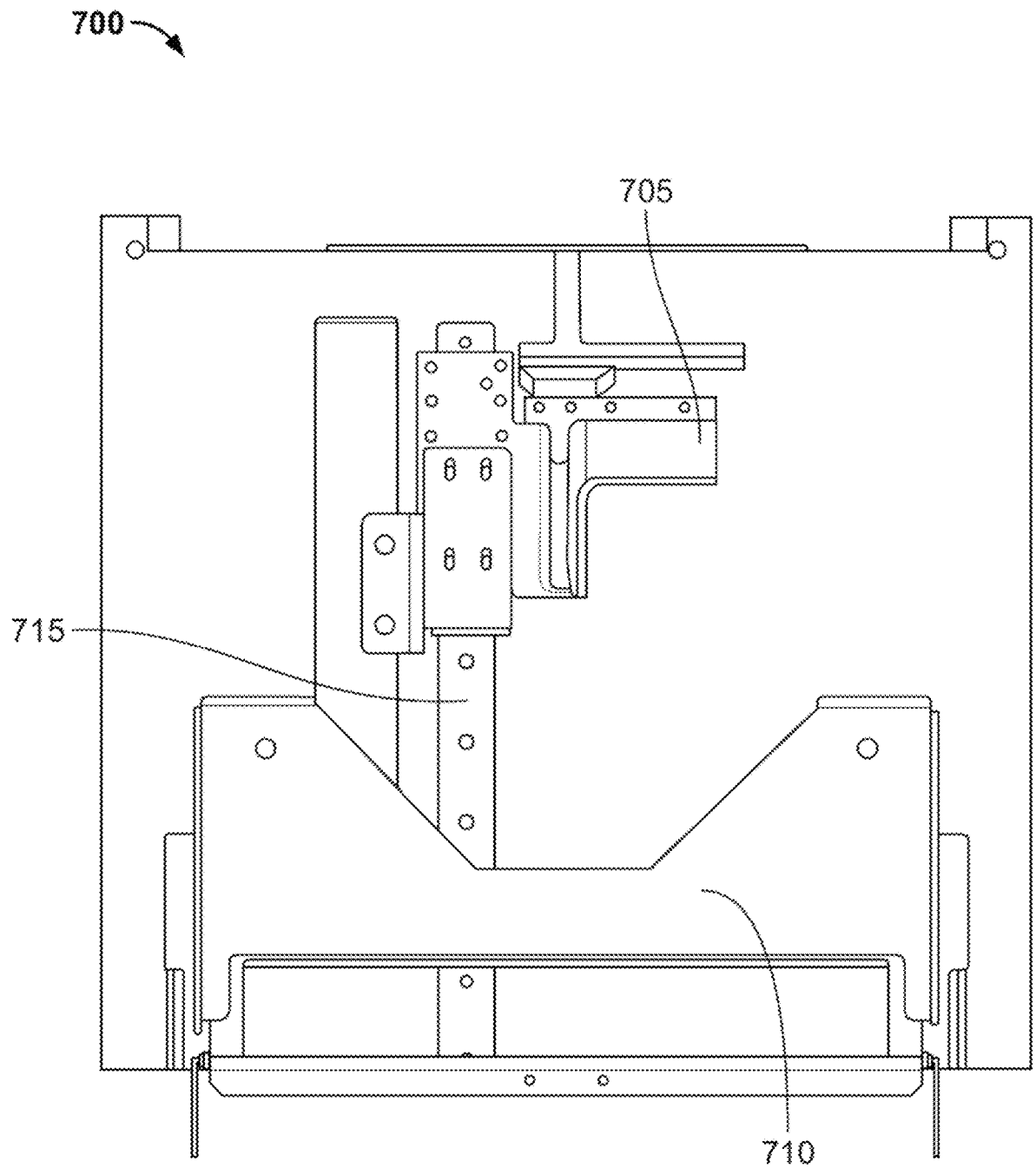
FIG. 7 is a front schematic view of an example door mechanism, according to aspects of the present disclosure.

FIG. 7 is a front schematic view of an example door mechanism 700, in accordance with embodiments of the present disclosure. Door mechanism 700 can position load port door 605 into the open position 635 and into the closed position 630. Door mechanism 700 can include actuator 705 and outrigger 710.

Actuator 705 can include one or more pneumatic devices, electromechanically driven devices, or similar mechanisms, where the pneumatic device(s) is capable of using compressed air or gasses to slide actuator 705 vertically along bar 715. Actuator 705 can be coupled to load port door 605. In some embodiments, the pneumatic device can slide actuator 705 upwards along bar 715 to position load port door 605 into the closed position 630, and can slide actuator 705 downward along bar 715 to position load port door 605 into the open position 635. In some embodiments, actuator 705 can include components capable of enabling the load port door 605 to swing open (e.g., move in an arc motion) from the closed portion 630 into the open position 635, and vice versa.

Pneumatic control 620 can operate a pneumatic device by using differential pressures and/or flows to push flexible diaphragms connected to mechanical values and similar devices to operate switches, open or close valves, move dampers, etc. By way of example, pneumatic control 620 can operate the pneumatic device using compressed air or gasses. The pneumatic device can be coupled to load port door 605. Pneumatic control 620 can receive instructions from and/or be operated by load port controller 615. For example, load port controller 615 can command pneumatic control 620 to position load port door 605 into the open position 635 and into the closed position 630.

Outrigger 710 can be any type of structure, such as a shelf or bracket, to support movement or handling of the load port when the load port is not coupled to the factory interface. In some embodiments, outrigger 710 can be an optional and removable component.

In other embodiments, a load port door can be attached to a pivot mechanism. The pivot mechanism can be attached to at least one side of a front face of a load port. Once the load port is connected to a factory interface (e.g., factory interface 106), a factory interface robot (e.g., factor interface robot 126) or actuator can disengage the load port door, and position the load port door from a closed position into an open position by moving the load port door horizontally and/or vertically and/or rotating the load port door around an axis of the pivot mechanism. The axis may be a vertical axis or a horizontal axis in embodiments. By way of exemplary example, the factory interface robot or actuator can rotate the door around the axis of the pivot mechanism approximately 90 degrees. Accordingly, the pivot mechanism enables the load port to have an overall height of approximately the height of the load port door, and an overall width of approximately the width of load port door. In an example, the door may be translated vertically and/or horizontally to clear a path in front of an opening of the load port. The vertical and/or horizontal translation may be accompanied by rotation as described above.

Figure 8:
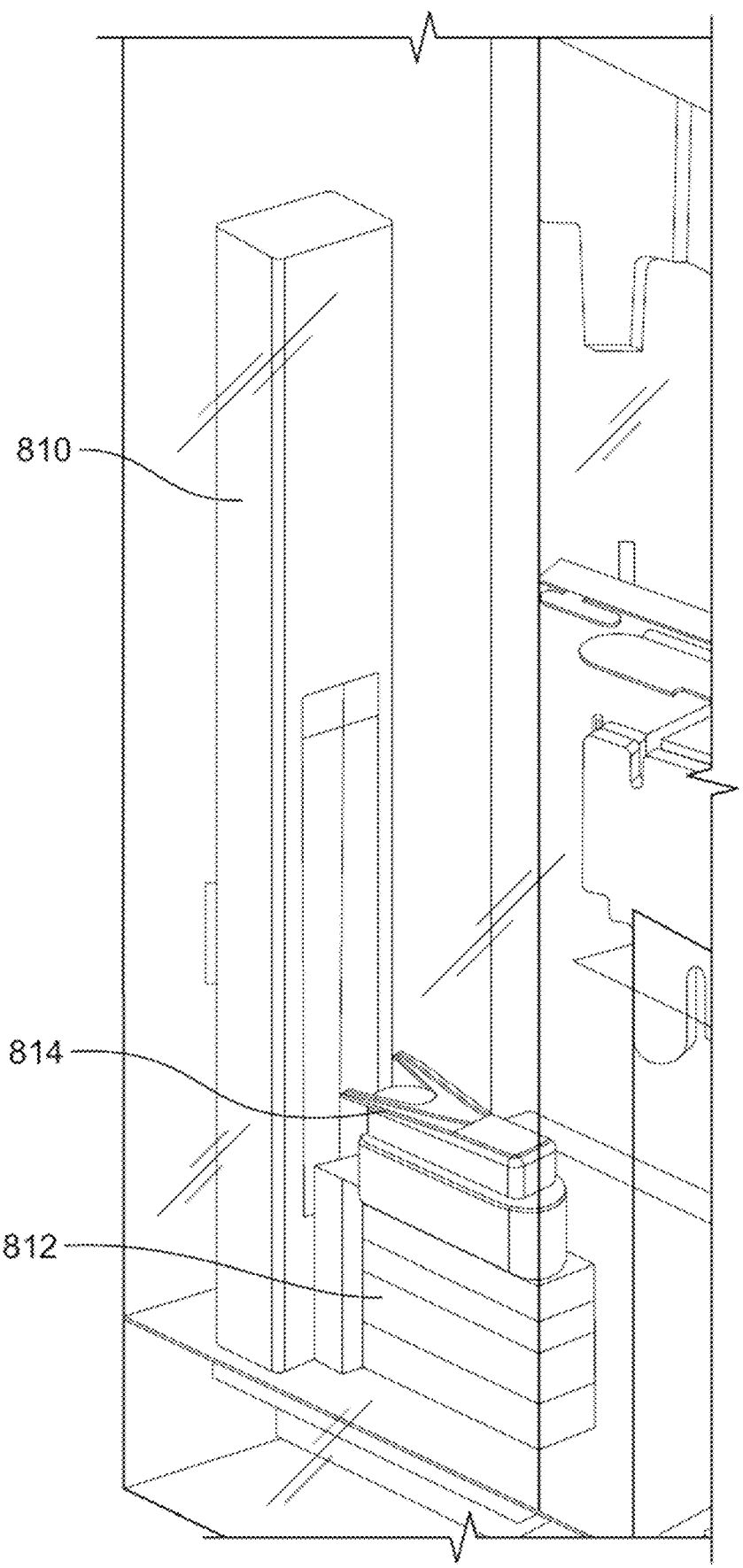
FIG. 8 is a perspective view of a factory interface robot, according to aspects of the present disclosure.

FIG. 8 is a perspective view of a factory interface robot 800, according to embodiments of the present disclosure. In some embodiments, factory interface robot 800 can be similar to factory interface robot 126A-B, and can be positioned within a factory interface (e.g., factory interface 106). Factory interface robot 800 can include vertical tower 810, links 812, and end effector 814.

The vertical tower 810 can be a structure configured to enable links 812 to traverse in the Z-direction (e.g., up and down vertically). Vertical tower 810 can include a vertical drive mechanism configured to provide links 812 with linear movement along the z-axis. For example, one or more links of links 812 can be configured to couple to the vertical drive mechanism. In some embodiments, the vertical drive mechanism can include a belt assembly, a chain assembly, a linear drive assembly, a slide assembly, an actuator assembly, a piston assembly, any combination thereof, or any other assembly or mechanism capable of enable links 812 to traverse alone the Z-axis. In some embodiments, vertical tower 810 can be coupled to a base configured to enable lateral movement of the factory interface robot 800. The base can include a horizontal drive mechanism, such as, for example, a belt assembly, a chain assembly, a linear drive assembly, a slide assembly, an actuator assembly, a piston assembly, any combination thereof, or any other assembly or mechanism capable of traversing factory interface robot 800 laterally within the factory interface.

Figure 9A:
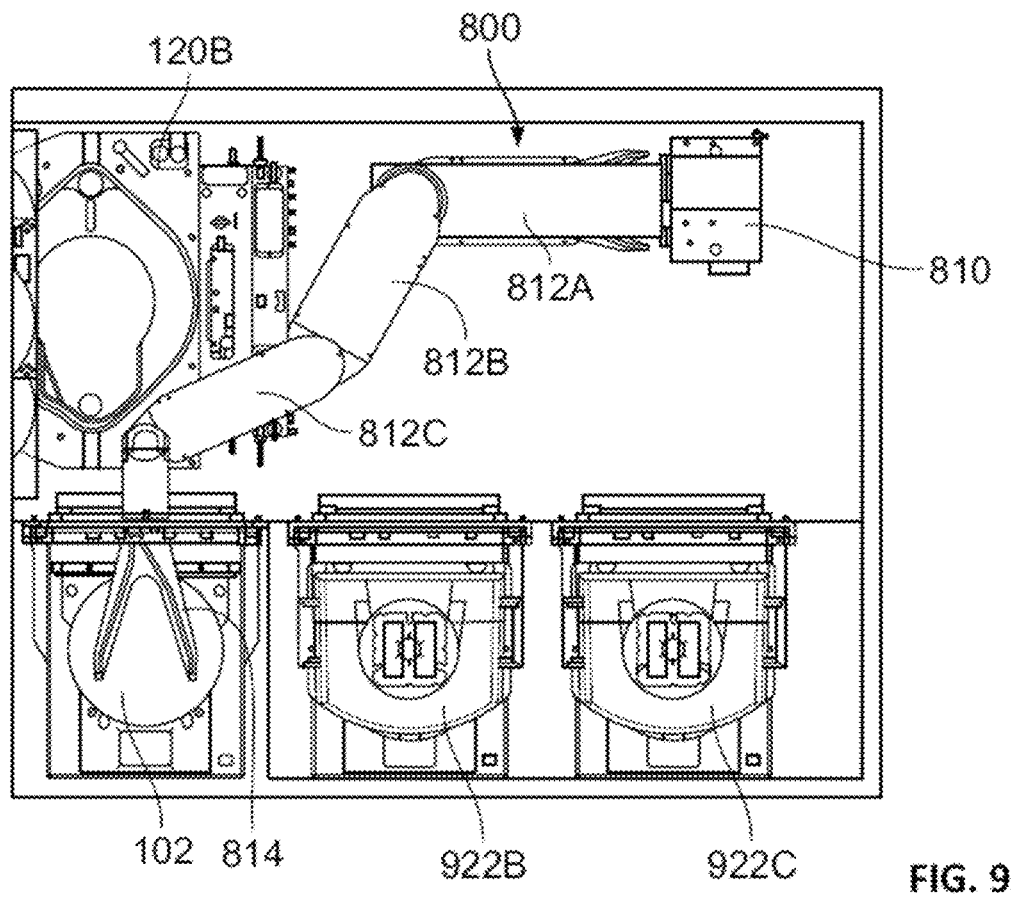
FIGS. 9A-9C are top views of a factory interface robot retrieving substrates from different substrate carriers, according to aspects of the present disclosure.
Figure 9B:
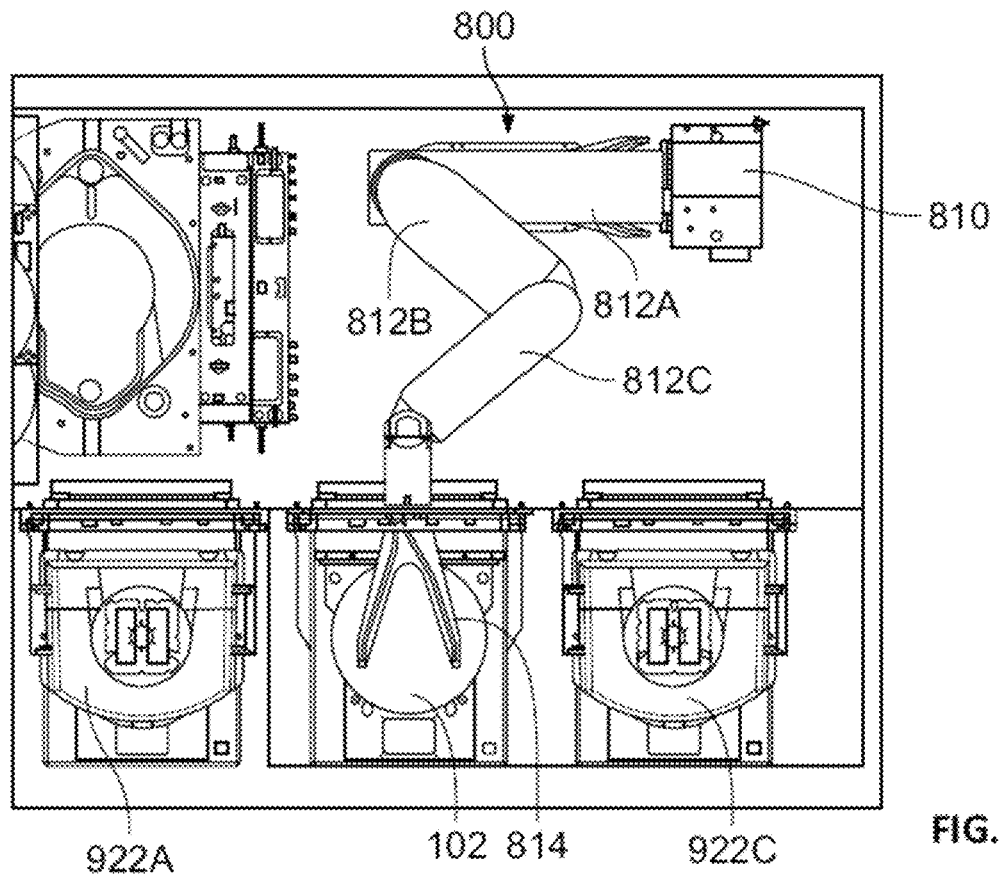
Figure 9C:
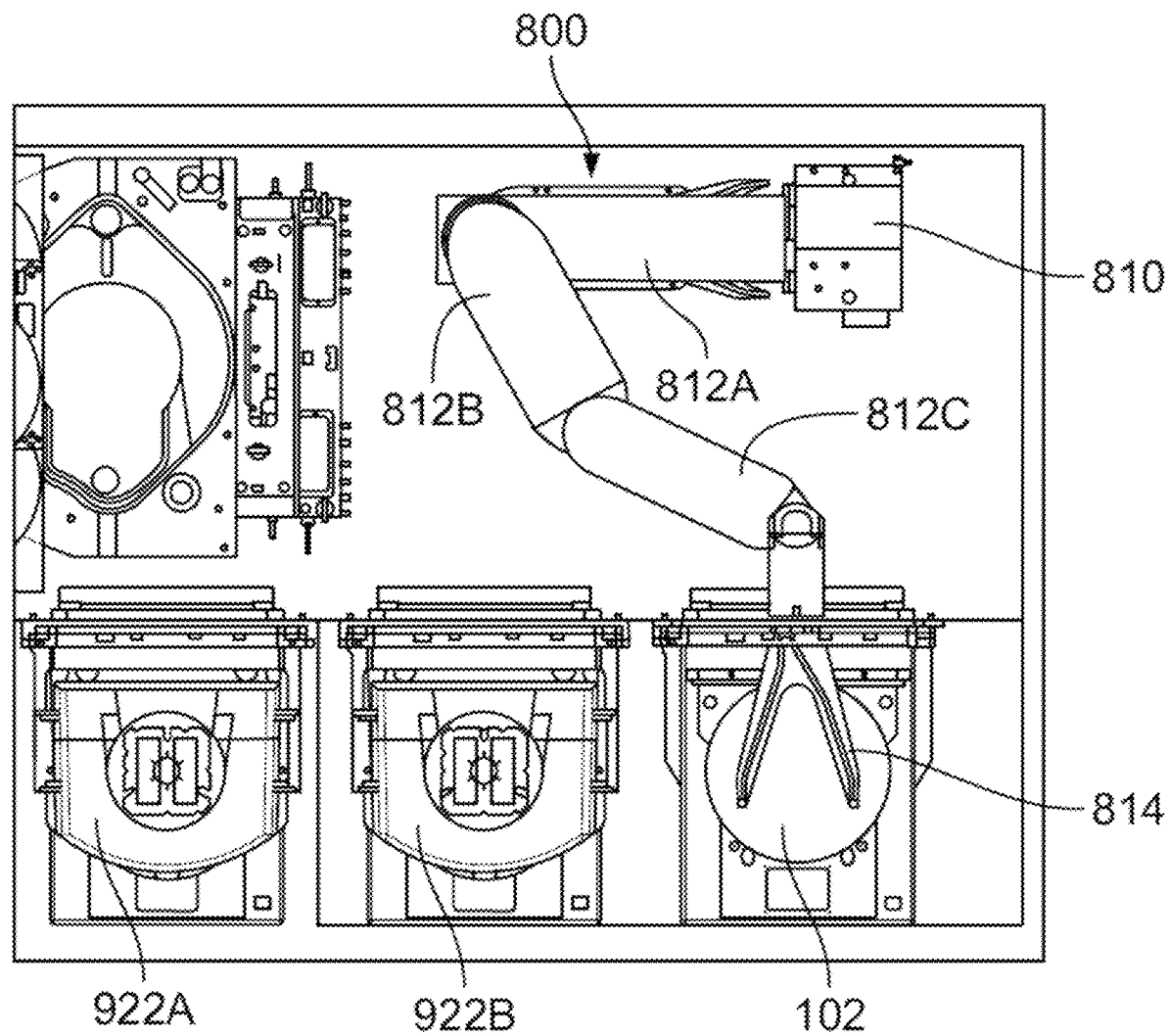

Links 812 can include one or more robot links (e.g., arms) coupled to each other via a joint. A proximal link of links 812 (e.g., link 812A as seen in FIGS. 9A-9C, which will be explained in greater detail below) can be coupled to the vertical drive mechanism while a distal link of links 812 (e.g., link 812C as seen in FIGS. 9A-9C) can be coupled to end effector 814. In some embodiments, factory interface robot 800 can include two or more end effectors coupled to the distal link. In some embodiments, one or more additional links (e.g., middle link 812B) can connect proximal link 812A to distal link 812C. In some embodiments, the proximal link can be fixed (e.g., can only move vertically along the z-axis, while unable to move along the x-axis or y-axis). The link and joint configuration can enable links 812 to traverse end effectors 814 along the x-axis and the y-axis. In some embodiments, links 812 can be similar to a SCARA robot. The combination of the vertical drive mechanism and the link and joint configuration enable factory interface robot 800 to operate in a three dimensions. For example, vertical drive mechanism can first raise or lower links 812 and end effector 814 to a desired elevation (e.g., the horizontal plane of a load lock, the horizontal plane of a load port, etc.), and links 812 can position end effector 814 along the desired position on said horizontal plane.

FIGS. 9A-9C are top views of a factory interface robot 800 retrieving substrates from different substrate carriers 922A-C, according to embodiments of the present disclosure. Factor interface robot 800 includes links 812A-C that connect the vertical tower 810 to the end effector 814. The vertical tower can position links 812A-C and end effector 814 at a predetermined elevation for retrieving substrates from substrate carriers 922A-C. Substrate carrier 922A-C can be similar or the same as substrate carrier 122. FIG. 9A shows factory interface robot 800 retrieving a substrate 102 from the left-most substrate carrier 922A. In particular, proximal link 812 is fixed, while middle link 812B and distal link 812C are positioned to enable end effector 814 to retrieve the substrate 102 from the left-most substrate carrier 922A. FIG. 9B shows factory interface robot 800 retrieving a substrate 102 from the center substrate carrier 922B. In particular, proximal link 812 is fixed, while middle link 812B and distal link 812C are positioned to enable end effector 814 to retrieve the substrate 102 from the center substrate carrier 922B. FIG. 9C shows factory interface robot 800 retrieving a substrate 102 from the right-most substrate carrier 922C. In particular, proximal link 812 is fixed, while middle link 812B and distal link 812C are positioned to enable end effector 814 to retrieve the substrate 102 from the right-most substrate carrier 922C. Accordingly, as illustrated, the combination of the z-direction motion enabled by vertical tower 810 and the horizontal motion enabled by links 812A-C enable the factory interface robot to retrieve substrates 102 from multiple substrate carriers in a compact environment due to the inclusion of the load locks within the factory interface.

Figure 10A:
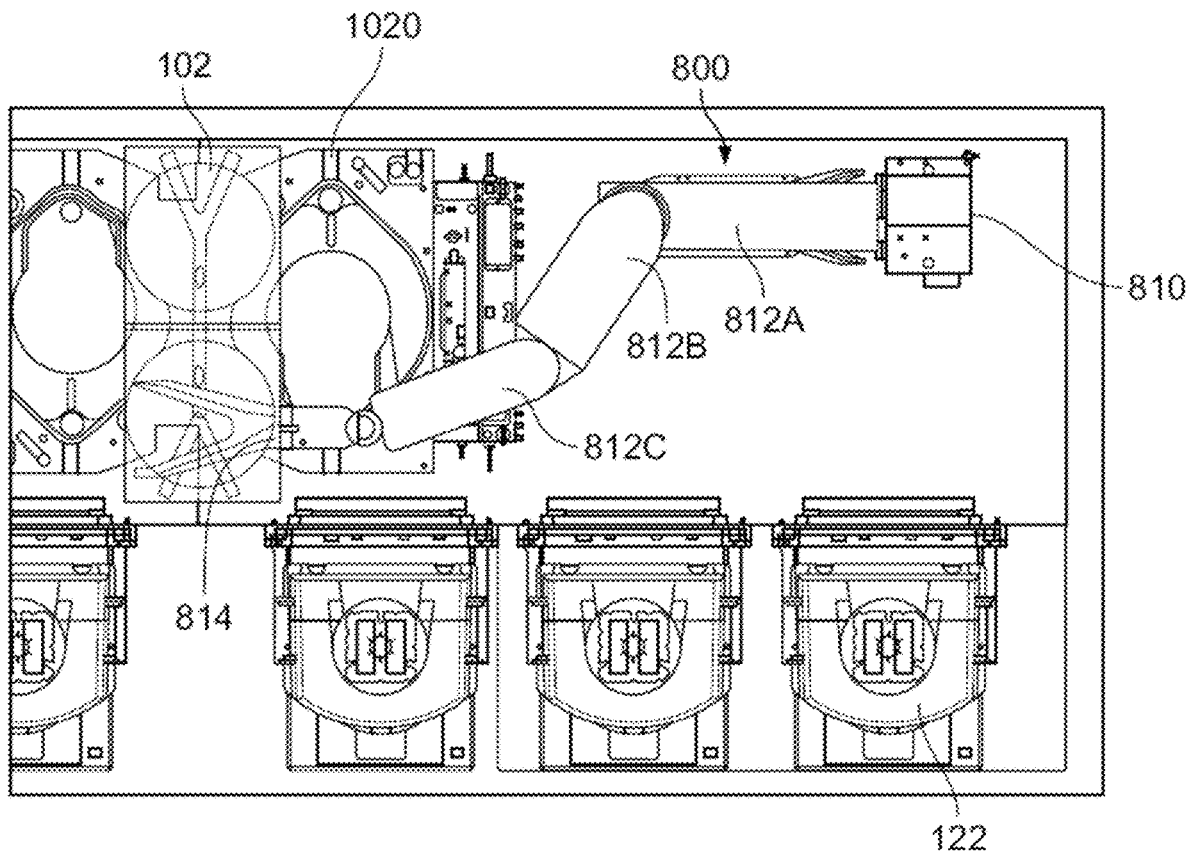
FIG. 10A is a top view of a factory interface robot in a pass through position, according to aspects of the present disclosure.

FIG. 10A is a top view of a factory interface robot 800 in a pass through position, according to embodiments of the present disclosure. The vertical tower can position links 812A-C and end effector 814 at a predetermined elevation for enabling factor interface robot 800 to pass a substrate to another factor interface robot. As shown, proximal link 812 is fixed, while middle link 812B and distal link 812C are positioned to enable end effector 814 to pass the substrate 102 from the factory interface robot 800 to another factory interface robot. Accordingly, as illustrated, the combination of the z-direction motion enabled by vertical tower 810 and the horizontal motion enabled by links 812A-C enable the factory interface robot to perform pass through operations within the factory interface.

Figure 10B:
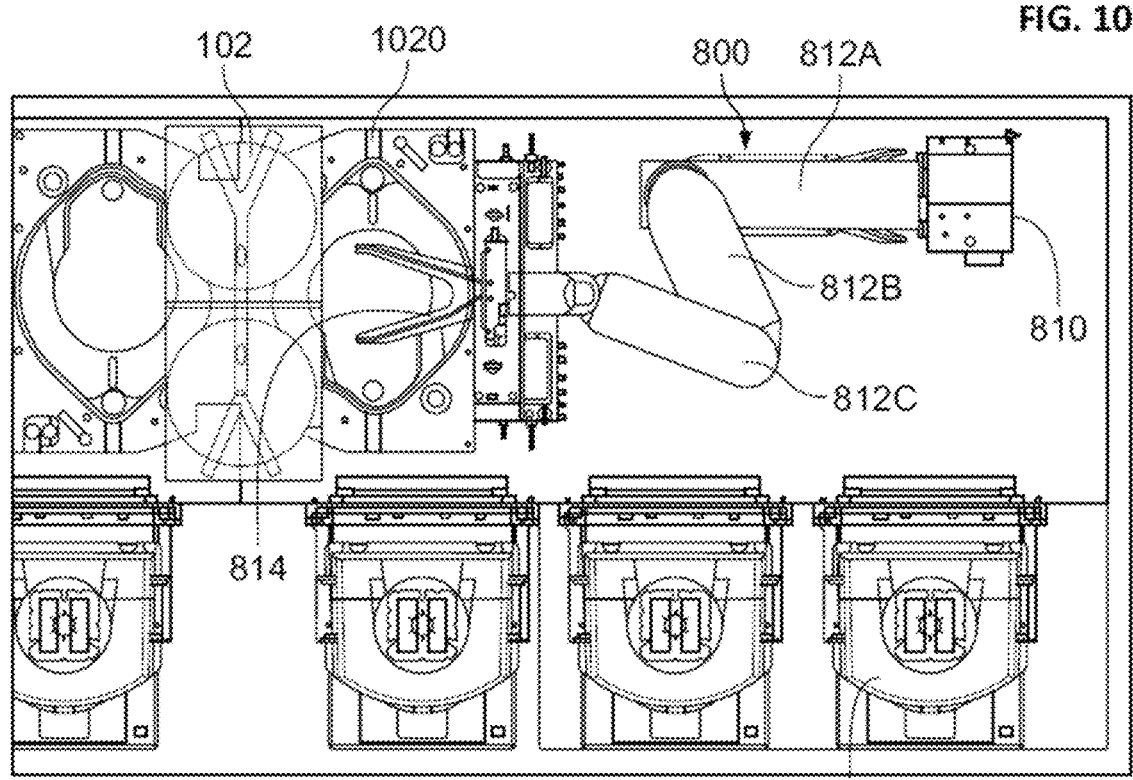
FIG. 10B is a top view of a factory interface robot retrieving substrates from load lock, according to aspects of the present disclosure.

FIG. 10B is a top view of a factory interface robot 800 retrieving substrates from load lock 1020B, according to embodiments of the present disclosure. The vertical tower can position links 812A-C and end effector 814 at a predetermined elevation for enabling factor interface robot 800 to retrieve (or position) one or more substrates from (or into) load lock 1020B. As shown, proximal link 812 is fixed, while middle link 812B and distal link 812C are positioned to enable end effector 814 to retrieve (or position) one or more substrates from (or into) load lock 1020B. Accordingly, as illustrated, the combination of the z-direction motion enabled by vertical tower 810 and the horizontal motion enabled by links 812A-C enable the factory interface robot 800 to retrieve or position substrates from or into a load lock within the factory interface.

FIG. 11 is a method for transporting substrates from a substrate carrier to a factory interface, in accordance with embodiments of the present disclosure. At block 1110, a load port receives a substrate carrier. In an example, the substrate carrier is a FOUP. In some embodiments, the load port includes a frame adapted for connecting the load port to the factory interface. The frame includes a transport opening through which one or more substrates are capable of being transported between the substrate carrier and the factory interface. The load port also includes an actuator coupled to the frame and a load port door coupled to the actuator. The load port door can be configured to seal the transport opening. The actuator is capable of positioning the load port door from a closed position to an open position, and from the open position to the closed position.

At block 1120, the load port door is positioned from the closed position to the open position via, for example, the door mechanism operated by the load port controller. At block 1130, a factory interface robot deposed within the factory interface retrieves a substrate from the substrate carrier. In some embodiments, prior to positioning the load port door from the closed position to the open position, the load port controller can engage a purge kit to purge the substrate carrier with an inert gas. In some embodiment, the factory interface robot can engage the vertical drive mechanism to position the end effector to horizontal plane associated with the load port.

FIG. 12 is a method for transporting substrates from a first factory interface robot to a second factory interface robot, in accordance with embodiments of the present disclosure. At block 1210, a first factory robot retrieves a substrate from a substrate carrier. In an example, the substrate carrier is a FOUP. At block 1220, the first factory interface robot transfers the substrate to a second factory robot. In an example, the first factory robot and the second factory robot are disposed within a factory interface. In another example, the first factory robot is disposed in a first factory interface, and the second factory robot is disposed in a second factory interface. The first factory robot and/or the second factory robot can engage a respective vertical drive mechanism to adjust the elevation of the end effector to a predetermined position associated with retrieving, transporting or transferring substrates. The first factory interface robot can be configured to transfer the substrate to the second factory interface robot using a pass through area. In a first example, the pass through area can be disposed between a front side of the factory interface and a front-facing side of a load lock. In a second example, the pass through area can be a via or open space disposed within the interior volume of the factory interface above one or more load locks. In a third example, the pass through area can be an open space or a via disposed between a pair of upper interior chambers and a pair of lower interior chambers of load locks (e.g., where the load locks are each a stacked load lock). In a fourth example, the pass through area can be an open space or a via disposed below one or more load locks. The first factory interface robot can be configured to transfer the substrate to the second factory interface robot through the pass through area.

At block 1230, the second factory interface robot places the substrate inside a load lock disposed within the factory interface. The load lock cannot be access by the first factory interface robot. In an example, the second factory robot can retrieve a substrate from inside the load lock disposed within the factory interface. The second factory robot can then transfer the substrate to the first factory robot. The second factory interface robot can be configured to transfer the substrate to the first factory interface robot using the pass through area. The first factory robot can then place the substrate within the substrate carrier.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A factory interface for an electronic device manufacturing system, the factory interface comprising:
   a first load lock disposed within an interior volume of the factory interface; and
   a first factory interface robot disposed within the interior volume of the factory interface, wherein:
   the first factory interface robot is configured to transfer substrates between a first set of substrate carriers and the first load lock; and
   the factory interface robot comprises a vertical tower, a plurality of links, and an end effector, wherein the vertical tower comprises a vertical drive mechanism configured to provide the plurality of links with linear movement in a z-axis and a proximal link of the plurality of links is coupled to the vertical drive mechanism.

2. The factory interface of claim 1, wherein a distal link of the plurality of links is coupled to the end effector.

3. The factory interface of claim 1, further comprising:
   a second load lock disposed within the interior volume of the factory interface; and a second factory interface robot configured to transfer substrates between a second set of substrate carriers and the second load lock.

4. The factory interface of claim 3, wherein the first load lock is nearer to the first factory interface robot than the second load lock and the second load lock is nearer to the second factory interface robot than the first load lock.

5. The factory interface of claim 3, further comprising:
a first set of load ports for receiving the first set of substrate carriers, wherein the first set of load ports are positioned to be accessible by the first factory interface robot; and
a second set of load ports for receiving the second set of substrate carriers, wherein the second set of load ports are positioned to be accessible by the second factory interface robot.

6. The factory interface of claim 5, wherein each load port of the first set of load ports and the second set of load ports comprises:
a transport opening through which one or more substrates are capable of being transported between the substrate carrier and the factory interface;
an actuator coupled to a frame; and
a load port door coupled to the actuator and configured to seal the transport opening, wherein:
the load port door comprises a first height;
the frame comprises a second height; and
the second height is at least 2 times greater than the first height, and less than 2.5 times the first height.

7. The factory interface of claim 5, further comprising:
at least one of a substrate storage container, metrology equipment, a server, or an air conditioning unit positioned below a load port of the first set of load ports.

8. The factory interface of claim 3, wherein the factory interface further comprises:
the interior volume defined by a bottom, a top and a plurality of sides, wherein the plurality of sides comprise a back side that is configured to face a transfer chamber of the electronic device manufacturing system, a front side, a right side and a left side, wherein the first factory interface robot is disposed within the interior volume proximate to the left side, wherein the second factory interface robot is disposed within the interior volume proximate to the right side, and wherein the first load lock and the second load lock are disposed adjacent to the back side and between the first factory interface robot and the second factory interface robot such that the first load lock is nearer to the first factory interface robot than the second load lock and the second load lock is nearer to the second factory interface robot than the first load lock.

9. The factory interface of claim 1, further comprising:
a via disposed within the interior volume of the factory interface above or below the first load lock, wherein the first factory interface robot is configured to transfer a substrate to a second factory interface robot through the via.

10. A factory interface robot, comprising:
a vertical tower configured to enable a plurality of links to traverse in a z-axis;
the plurality of links, coupled to the vertical tower and configured to move an end effector along an x-axis and a y-axis;
a vertical drive mechanism configured to provide the plurality of links with linear movement in the z-axis, wherein a proximal link of the plurality of links is coupled to the vertical drive mechanism; and
the end effector, coupled to the plurality of links and configured to handle a substrate, wherein the factory interface robot and a load lock are disposed within an interior volume of a factory interface.

11. The factory interface robot of claim 10, wherein the factory interface robot is configured to transfer substrates between a substrate carrier and the load lock.

12. The factory interface robot of claim 11, wherein the factory interface comprises a load port for receiving the substrate carrier, wherein the load port is positioned to be accessible by the factory interface robot.

13. The factory interface robot of claim 10, wherein:
the proximal link is in a fixed lateral position.

14. The factory interface of claim 10, wherein a distal link of the plurality of links is coupled to the end effector.

15. A method for transporting substrates from a first factory interface robot to a second factory interface robot, comprising:
retrieving, by an end effector of the first factory interface robot, a substrate from a substrate carrier;
adjusting a vertical position of the end effector by a vertical drive mechanism of the first factory interface robot, wherein the vertical drive mechanism is configured to provide a plurality of links with linear movement in a z-axis and a proximal link of the plurality of links is coupled to the vertical drive mechanism; and
transferring the substrate from the first factory interface robot to the second factory interface robot, wherein the first factory interface robot and the second factory interface robot are disposed within a factory interface.

16. The method of claim 15, further comprising placing the substrate, via the second factory interface robot, inside a load lock disposed within the factory interface, wherein the first factory interface robot cannot access the load lock.

17. The method of claim 16, wherein the substrate is transferred through a via disposed within an interior volume of the factory interface above or below the load lock.

* * * * *